United States Patent
Sanada et al.

(10) Patent No.: US 9,686,854 B2
(45) Date of Patent: Jun. 20, 2017

(54) ELECTRONIC DEVICE

(71) Applicant: DENSO CORPORATION, Kariya, Aichi-pref. (JP)

(72) Inventors: Yuuki Sanada, Nagoya (JP); Norihisa Imaizumi, Toyokawa (JP); Shinya Uchibori, Okazaki (JP); Masaji Imada, Toyohashi (JP); Toshihiro Nakamura, Okazaki (JP); Eiji Yabuta, Okazaki (JP); Masayuki Takenaka, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/427,458

(22) PCT Filed: Sep. 24, 2013

(86) PCT No.: PCT/JP2013/005647
§ 371 (c)(1),
(2) Date: Mar. 11, 2015

(87) PCT Pub. No.: WO2014/050081
PCT Pub. Date: Apr. 3, 2014

(65) Prior Publication Data
US 2015/0319840 A1    Nov. 5, 2015

(30) Foreign Application Priority Data

Sep. 25, 2012 (JP) .................................. 2012-211024
Sep. 24, 2013 (JP) .................................. 2013-196807

(51) Int. Cl.
*H05K 1/00* (2006.01)
*H05K 1/02* (2006.01)
(Continued)

(52) U.S. Cl.
CPC ........... *H05K 1/0204* (2013.01); *H01L 23/13* (2013.01); *H01L 23/3677* (2013.01);
(Continued)

(58) Field of Classification Search
None
See application file for complete search history.

(56) References Cited

U.S. PATENT DOCUMENTS 6,876,091 B2 *  4/2005  Takeuchi .......... H01L 23/49822
                                                    257/687
2004/0042180 A1   3/2004  Yamaguchi
(Continued)

FOREIGN PATENT DOCUMENTS

JP      H04-279097 A    10/1992
JP      H05-259669 A    10/1993
(Continued)

OTHER PUBLICATIONS

Office Action mailed May 12, 2015 issued in corresponding JP patent application No. 2013-196807 (and English translation).
(Continued)

*Primary Examiner* — Courtney Smith
*Assistant Examiner* — Zhengfu Feng
(74) *Attorney, Agent, or Firm* — Posz Law Group, PLC

(57) ABSTRACT

In an electronic device, a heat generating element is connected directly to an electrically-conductive joining material that is the start point of the heat dissipation path on the one surface of the substrate, and the other surface of the substrate is provided by an other surface side insulating layer. An electrically-conductive other surface side electrode connected to an external heat dissipation member is disposed on the surface of the other surface side insulating layer right under the heat generating element. On the other surface side of the substrate, an other surface side inner layer wire that is the end point of the heat dissipation path extends to the other surface side insulating layer and is insulated electrically from the other surface side electrode through the other surface side insulating layer.

20 Claims, 11 Drawing Sheets

(51) Int. Cl.
- *H05K 1/18* (2006.01)
- *H01L 23/13* (2006.01)
- *H05K 7/20* (2006.01)
- *H01L 23/367* (2006.01)
- *H01L 23/373* (2006.01)

(52) U.S. Cl.
CPC ........... *H05K 1/0206* (2013.01); *H05K 1/181* (2013.01); *H05K 1/182* (2013.01); *H05K 7/205* (2013.01); *H05K 7/20854* (2013.01); *H01L 23/367* (2013.01); *H01L 23/3735* (2013.01); *H01L 2224/32225* (2013.01); *H01L 2924/13055* (2013.01); *H01L 2924/19105* (2013.01); *H05K 1/0209* (2013.01); *H05K 2201/09781* (2013.01); *H05K 2201/10166* (2013.01)

(56) References Cited

U.S. PATENT DOCUMENTS

| | | | |
|---|---|---|---|
| 2006/0097382 A1 | 5/2006 | Mori et al. | |
| 2009/0000812 A1* | 1/2009 | Kariya | H01L 23/49827 174/260 |
| 2009/0152714 A1* | 6/2009 | Yamagishi | H01L 24/83 257/724 |
| 2010/0139968 A1* | 6/2010 | Takenaka | H01L 23/49822 174/263 |
| 2010/0214751 A1* | 8/2010 | Aoki | H05K 1/145 361/772 |
| 2010/0252304 A1* | 10/2010 | Muramatsu | H01L 21/563 174/251 |
| 2011/0094780 A1* | 4/2011 | Uchibori | H05K 1/0265 174/258 |
| 2011/0155433 A1* | 6/2011 | Funaya | H01L 23/49827 174/258 |
| 2011/0156228 A1* | 6/2011 | Kobayashi | H01L 23/3677 257/676 |
| 2011/0308849 A1* | 12/2011 | Kondo | H01L 23/49827 174/260 |

FOREIGN PATENT DOCUMENTS

| | | | |
|---|---|---|---|
| JP | H07-321471 | A | 12/1995 |
| JP | H09-153679 | A | 6/1997 |
| JP | H10-056097 | A | 2/1998 |
| JP | H10-256429 | A | 9/1998 |
| JP | 2001-267486 | A | 9/2001 |
| JP | 2006-114606 | A | 4/2006 |
| JP | 2007-096009 | A | 4/2007 |
| JP | 2008-124088 | A | 5/2008 |
| JP | 2009-158715 | A | 7/2009 |
| JP | 2009-277726 | A | 11/2009 |
| JP | 2011-082250 | A | 4/2011 |
| JP | 2011-091152 | A | 5/2011 |
| JP | 2011-142162 | A | 7/2011 |
| JP | 2012-009608 | A | 1/2012 |
| JP | 2012009608 | A * | 1/2012 |
| JP | 2012-119509 | A | 6/2012 |

OTHER PUBLICATIONS

International Search Report and Written Opinion of the International Searching Authority mailed Dec. 17, 2013 in the corresponding International application No. PCT/JP2013/005647 (and English translation).

Office Action mailed Apr. 15, 2014 issued in corresponding JP patent application No. 2014-061659 (divisional of JP 2013-196807) (and English translation).

Office Action mailed Jun. 3, 2014 issued in corresponding JP patent application No. 2014-061659 (divisional of JP 2013-196807) (and English translation).

Office Action mailed Nov. 18, 2014 issued in corresponding JP patent application No. JP 2013-196807 (and English translation).

* cited by examiner

ELECTRONIC DEVICE

CROSS-REFERENCE TO RELATED APPLICATIONS

The present application is a U.S. national stage of International Application No. PCT/JP2013/005647 filed on Sep. 24, 2013 and is based on Japanese Patent Application No. 2012-211024 filed on Sep. 25, 2012 and Japanese Patent Application No. 2013-196807 filed on Sep. 24, 2013, the disclosures of which are incorporated herein by reference.

TECHNICAL FIELD

The present disclosure relates to an electronic device including an electrically-conductive heat dissipation path formed in the thickness direction of a substrate so as to dissipate heat from a heat generating element on the one surface side of the substrate to the other surface side of the substrate.

BACKGROUND ART

As such an electronic device heretofore, an electronic device including a substrate having one surface on the top and the other surface on the bottom, a heat generating element mounted over the one surface of the substrate, and an electrically-conductive heat dissipation path that is formed in the manner of extending continuously from the one surface side of the substrate to the other surface side in the interior of the substrate and dissipates the heat generated in the heat generating element to the other surface side of the substrate has been disclosed (refer to Patent Literature 1).

The electronic device is configured by connecting a surface wire on the one surface side of the substrate to a surface wire on the other surface side through the electrically-conductive via extending in the thickness direction of the substrate and forming a heat dissipation path with both the surface wires and the via. The heat of a heat generating element mounted on the one surface side of the substrate is dissipated to the other surface side of the substrate through the heat dissipation path.

PRIOR ART LITERATURES

Patent Literature

Patent Literature 1: JP 2004-95586 A

SUMMARY OF INVENTION

Here, for example, an external heat dissipation member is connected to the other surface of a substrate, and the heat from a heat dissipation path is dissipated further to the heat dissipation member. However, an electrically-conductive member such as a heat sink is generally used as the external heat dissipation member.

Conventionally, however, a heat dissipation path is electrically conductive and the potential of a heat generating element is exposed to the other surface of a substrate through a surface wire or the like on the other surface of the substrate. It is therefore difficult to connect the external heat dissipation member on the other surface of the substrate. That is, it is difficult to dissipate heat through the heat dissipation path without exposing the potential of the heat generating element to the other surface of the substrate.

The present disclosure is made in view of the foregoing issue, and an object thereof is, in an electronic device in which an electrically-conductive heat dissipation path is disposed in a thickness direction of a substrate to dissipate heat of a heat generating element on one surface side of the substrate to the other surface side of the substrate, to enable a heat dissipation appropriately on the other surface side of the substrate without exposing a potential of the heat generating element on the one surface side of the substrate to the other surface side of the substrate through the heat dissipation path.

The inventors have: focused on forming an electrically-insulative insulating layer in the thickness direction of a substrate and electrically insulating a heat dissipation path with the insulating layer; and earnestly studied on at which part in the thickness direction of the substrate the insulating layer should be formed.

Such an insulating layer has a thermal conductivity inferior to an electrically-conductive material such as Cu used for an electrode or a wire in a substrate on one level or another. Consequently, the heat of a heat generating element is dissipated more efficiently when an insulating layer is formed on the end point side of a heat dissipation path far from the heat generating element than when it is formed at a portion close to the heat generating element in the heat dissipation path. Thus, the inventors have: thought that it is effective to form an insulating layer over the other surface of a substrate farthest from a heat generating element; and created the present disclosure.

According to a first aspect of the present disclosure, an electronic device includes: a substrate having one surface and the other surface; a heat generating element mounted on the one surface of the substrate; and an electrically-conductive heat dissipation path being disposed to extend continuously from a one surface side of the substrate to an other surface side of the substrate in the interior of the substrate and dissipating heat generated in the heat generating element to the other surface side of the substrate.

The heat generating element is connected directly to the heat dissipation path on the one surface of the substrate, and the other surface of the substrate is provided by an other surface side insulating layer having an electrical insulation property. An electrically-conductive other surface side electrode connected to an external heat dissipation member is disposed on the surface of the other surface side insulating layer right under the heat generating element. On the other surface side of the substrate, an end point of the heat dissipation path extends up to the other surface side insulating layer, and the other surface side insulating layer is interposed between the end point of the heat dissipation path and the other surface side electrode. Therefore, the end point of the heat dissipation path is insulated electrically from the other surface side electrode.

As a result, the end point of the heat dissipation path does not expose to the other surface of the substrate by the other surface side insulating layer constituting the other surface of the substrate and hence it is possible to appropriately dissipate heat on the other surface side of the substrate without exposing the potential of the heat generating element on the one surface side of the substrate to the other surface side of the substrate through the heat dissipation path.

According to a second aspect of the present disclosure, in an electronic device according to the first embodiment, the substrate is made of a resin, and a molding resin to seal the heat generating element and the one surface of the substrate is disposed on the one surface side of the substrate. The other surface of the substrate is exposed from the molding resin.

A solder resist film to cover and protect the other surface of the substrate is disposed on the other surface of the substrate. The solder resist film is thicker than the other surface side electrode located right under the heat generating element and is arranged around the other surface side electrode while the other surface side electrode is exposed. A portion of the substrate right under the heat generating element is deformed so that the one surface of the substrate is recessed and the other surface of the substrate is projected, and thus a center of the other surface side electrode protrudes from the periphery thereof.

As a result, the substrate is deformed and the center of the other surface side electrode is protruded by a molding pressure of the molding resin so as to fill as much as possible the level difference formed between the other surface side electrode and the solder resist film due to the solder resist film being thicker. Consequently, when the other surface side electrode is connected to the external heat dissipation member with a thermally-conductive joining material such as solder interposed, it is possible to reduce to the utmost the thickness of the thermally-conductive joining material corresponding to the protrusion of the other surface side electrode.

According to a third aspect of the present disclosure, in an electronic device according to the first or second aspect, the heat dissipation path has: a one surface side inner layer wire extending in the planar direction of the substrate and being located in the interior of the substrate on the one surface side of the substrate; an other surface side inner layer wire extending in the planar direction of the substrate and being located in the interior of the substrate on the other surface side of the substrate; and a blind via extending in the thickness direction of the substrate and connecting the one surface side inner layer wire to the other surface side inner layer wire.

As a result, it is possible to spread and release heat in the planar direction of the substrate by the inner layer wires extending in the planar direction of the substrate.

According to a fourth aspect of the present disclosure, the dimensions of the one surface side inner layer wire and the other surface side inner layer wire in the planar direction of the substrate may be larger than the dimension of the heat generating element in the planar direction of the substrate. As a result, it is possible to dissipate heat more broadly in the planar direction of the substrate.

According to a fifth aspect of the present disclosure, an electronic device includes: an electrically-insulative substrate having one surface and the other surface; a one surface side wire disposed on the one surface of the substrate; a one surface side land disposed on the one surface of the substrate and patterned together with the one surface side wire; a heat generating element mounted on the one surface of the substrate; an other element mounted together with the heat generating element on the one surface of the substrate; and an electrically-conductive heat dissipation path being disposed to extend continuously from the one surface side of the substrate to the other surface side in the interior of the substrate right under the heat generating element and dissipating the heat generated in the heat generating element to the other surface side of the substrate.

Further, on the one surface of the substrate, the heat generating element is joined directly to the one surface side land with an electrically-conductive joining material interposed and thereby the heat dissipation path having the one surface side land and the electrically-conductive joining material as the start point is connected directly to the heat generating element. The one surface side land exists over a whole area of the heat generating element projected onto the one surface of the substrate right under the heat generating element, and the dimension of the one surface side land in the planar direction of the substrate is larger than the dimension of the heat generating element in the planar direction of the substrate.

The other surface side of the substrate includes an other surface side insulating layer as a part of the substrate having an electrical insulation property and being disposed over the whole of the substrate in the planar direction of the substrate. An electrically-conductive other surface side land is disposed on the other surface of the substrate right under the heat generating element. An other surface side wire is disposed on the other surface of the substrate and the other surface side land is patterned together with the other surface side wire and is electrically independent from the other surface side wire. An end point of the heat dissipation path extends up to the other surface side insulating layer on the other surface side of the substrate. The end point of the heat dissipation path is provided as an other surface side inner layer wire acting as a thermal diffusion layer.

Further, the other surface side insulating layer is interposed between the other surface side inner layer wire and the other surface side land, the other surface side inner layer wire is insulated electrically from the other surface side land, and thereby the other surface side inner layer wire, the other surface side land, and the other surface side insulating layer interposed between them constitute a thermal diffusion insulating section. In the thermal diffusion insulating section, both the other surface side inner layer wire and the other surface side land exist over the whole area of the heat generating element projected onto the one surface of the substrate right under the heat generating element. The dimensions of the other surface side inner layer wire and the other surface side land in the planar direction of the substrate are larger than the dimension of the heat generating element in the planar direction of the substrate.

As a result, the end point of the heat dissipation path is not exposed to the other surface of the substrate by the other surface side insulating layer constituting the other surface of the substrate and hence it is possible to appropriately dissipate heat on the other surface side of the substrate without exposing the potential of the heat generating element on the one surface side of the substrate to the other surface side of the substrate through the heat dissipation path.

According to a sixth aspect of the present disclosure, an electronic device includes: an electrically-insulated substrate having one surface and the other surface; a heat generating element mounted on the one surface of the substrate; an other element mounted together with the heat generating element on the one surface of the substrate; a one surface side wire disposed on the one surface of the substrate; an electrically-conductive one surface side land disposed on the one surface of the substrate and patterned together with the one surface side wire; an other surface side wire disposed on the other surface of the substrate; and an electrically-conductive other surface side land disposed on the other surface of the substrate, patterned together with the other surface side wire, and being electrically independent from at least a part of the other surface side wire.

The heat generating element has a joining plane to be electrically joined to the one surface side land, and the one surface side land has a joined plane to be electrically joined to the heat generating element. The joined plane exists at least in a whole region of the joining plane projected in the thickness direction of the substrate. The electronic device has an electrically-conductive joining material to directly join the joining plane to the joined plane in the whole projected region.

In the electronic device according to the sixth aspect of the present disclosure, further, the other surface side of the substrate includes an other surface side substrate insulating layer as a part of the electrically-insulated substrate disposed on the whole of the substrate in the planar direction of the substrate. The electronic device includes an electrically-conductive heat dissipation path having the one surface side land and the electrically-conductive joining material as a start point and being disposed to extend continuously from the one surface side of the substrate to the other surface side substrate insulating layer and dissipating the heat generated in the heat generating element to the other surface side of the substrate. An end point of the heat dissipation path includes an electrically-conductive other surface side inner layer wire formed in the interior of the substrate. When a region obtained by expanding the planar size of the heat generating element in the planar direction of the substrate from the heat generating element further toward the outside by the extent corresponding to the thickness of the substrate at the whole periphery of the heat generating element is defined as a heat dissipation contributing region, the other surface side substrate insulating layer is interposed between the other surface side inner layer wire and the other surface side land in the heat dissipation contributing region and electrically insulates the other surface side inner layer wire from the other surface side land. At least a part of the other surface side inner layer wire and at least a part of the other surface side land have a total area larger than the area of the heat generating element in the planar direction of the substrate in the heat dissipation contributing region and constitute a thermal diffusion layer pair. Thus, a thermal diffusion insulating section including the other surface side inner layer wire, the other surface side land, and the other surface side substrate insulating layer is formed on the other surface side of the substrate.

As a result, the end point of the heat dissipation path is not exposed to the other surface of the substrate by the other surface side substrate insulating layer constituting the other surface of the substrate and hence it is possible to appropriately dissipate heat on the other surface side of the substrate without exposing the potential of the heat generating element on the one surface side of the substrate to the other surface side of the substrate through the heat dissipation path.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
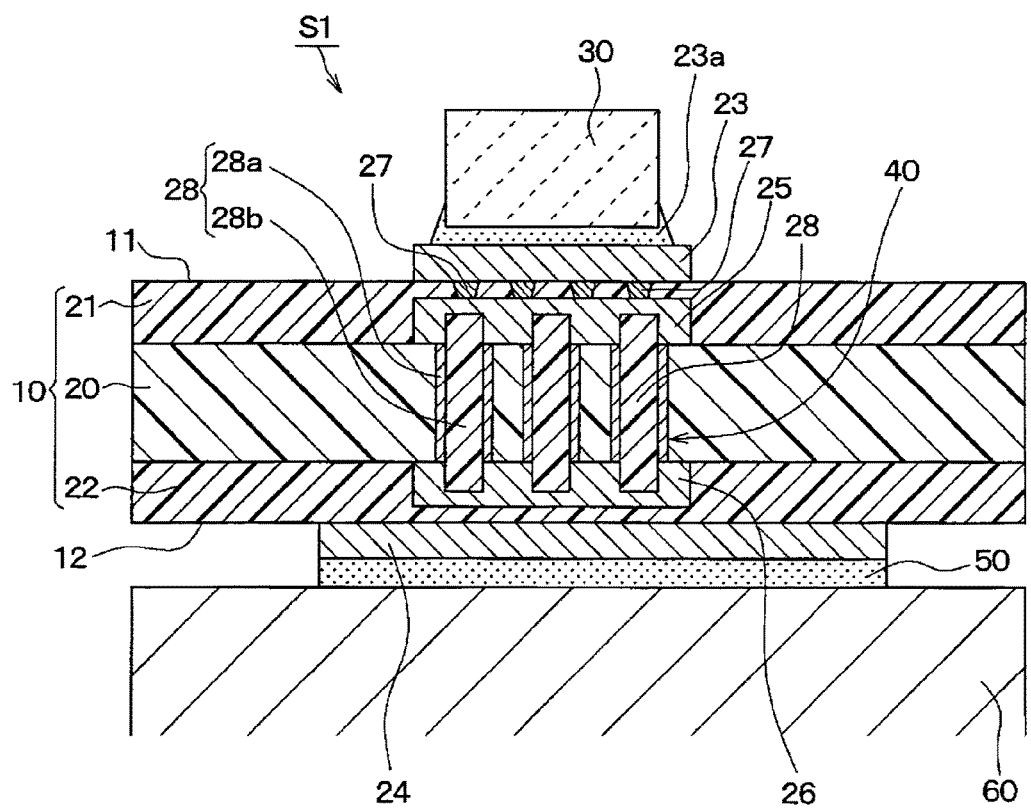
FIG. 1 is a schematic sectional view of an electronic device according to First Embodiment of the present disclosure.

Embodiments according to the present disclosure are hereunder explained on the basis of the drawings. Here, in the following embodiments, parts identical or equal to each other are represented by an identical sign in the drawings in order to simplify the explanations.

First Embodiment

An electronic device S1 according to First Embodiment of the present disclosure is described in reference to FIG. 1. Here, FIG. 1 shows the state of connecting the electronic device S1 to an external heat dissipation member 60 with a thermally-conductive joining material 50 interposed. The electronic device S1 is applied to an electronic device mounted on an automobile for example.

The electronic device S1 according to the present embodiment roughly includes a substrate 10, a heat generating element 30 mounted on the one surface 11 of the substrate 10, and an electrically-conductive heat dissipation path 40 being disposed in the substrate 10 and dissipating the heat generated in the heat generating element 30 to the side of an other surface 12 of the substrate 10.

The substrate 10 is made of a resin and has a plate shape with the one surface (first surface) 11 on the top and the other surface (second surface) 12 on the bottom. The substrate 10 is a laminated substrate including a plate-shaped core 20 made of an epoxy resin or the like and electrically-insulative insulating layers 21 and 22 that are made of an epoxy resin or the like and disposed on both the surfaces of the core 20. In this case, the substrate 10 is made of the three layers 20, 21, and 22.

Here, it is desirable that the resin constituting the other surface side insulating layer 22 has a higher thermal conductivity than the resins of the core 20 and the one surface side insulating layer 21. This can be materialized easily for example by changing the quantity of a thermally-conductive filler contained in a resin or changing the type of an epoxy resin between the former resin and the latter resins.

In the substrate 10 according to the present embodiment, the surface of the one surface side insulating layer 21 located closer to the side of the one surface 11 of the substrate 10 than the core 20 corresponds to the one surface 11 of the substrate 10 and the surface of the other surface side insulating layer 22 located closer to the side of the other surface 12 of the substrate 10 than the core 20 corresponds to the other surface 12 of the substrate 10.

A one surface side electrode 23 being made of Cu or the like and being exposed to the one surface 11 is disposed on the one surface 11 of the substrate 10. The heat generating element 30 is mounted on the one surface side electrode 23 on the one surface 11 of the substrate 10. The heat generating element 30 (here the bottom surface side of the element) is connected thermally- and electrically-conductively to the one surface side electrode 23 with an electrically-conductive joining material 23a such as solder or an electrically-conductive adhesive interposed.

The heat generating element 30 generates heat when a power transistor or an IGBT is driven. Here, circuit constituting conductors including wires, electrodes, and others constituting a circuit, those being not shown in the figure, are disposed on the surfaces 11 and 12 and in the interior of the substrate 10 in the same manner as an ordinary circuit substrate and the surface side of the heat generating element 30 is connected to the circuit conductors by wire bonding or the like.

Further, an electrically-conductive other surface side electrode 24 being made of Cu or the like and being exposed to the other surface 12 is disposed on the other surface 12 of the substrate 10. The other surface side electrode 24 is disposed electrically independently from all electrically-conductive elements other than the other surface side electrode 24 in the substrate 10 and used for being connected to an external heat dissipation member 60.

The electronic device S1 is connected to the external heat dissipation member 60 through the other surface side electrode 24 with the thermally-conductive joining material 50 interposed. As the thermally-conductive joining material 50, an electrically-conductive material such as solder or silver paste may be used besides insulative heat dissipation grease such as silicon grease. The external heat dissipation member 60 is a heat sink of Cu, Fe, or the like or a casing of Al or the like.

Further, in the interior of the substrate 10, a one surface side inner layer wire 25 being made of Cu or the like having an electrical conductivity and extending in the planar direction of the substrate 10 is disposed between the one surface side insulating layer 21 and the core 20. An other surface side inner layer wire 26 being made of Cu or the like having an electrical conductivity and extending in the planar direction of the substrate 10 is disposed between the core 20 and the other surface side insulating layer 22.

Further, laser vias 27 being made of Cu or the like, passing through the one surface side insulating layer 21, and extending in the thickness direction of the substrate 10 are disposed in the one surface side insulating layer 21, and the one surface side electrode 23 is connected thermally-conductively to the one surface side inner layer wire 25 through the laser vias 27. Each of the laser vias 27 is formed by boring a hole in the one surface side insulating layer 21 by a laser and filling the hole with Cu plating or the like.

Further, blind vias 28 passing through the core 20 and extending in the thickness direction of the substrate 10 are disposed in the core 20, and the one surface side inner layer wire 25 is connected thermally-conductively to the other surface side inner layer wire 26 through the blind vias 28.

Each of the blind vias 28 includes a Cu plating 28a disposed on the side surface of a through-hole formed in the core 20 and an electrically-insulative filler 28b such as an epoxy resin filled inside the Cu plating 28a. The blind via 28 may be formed by an ordinary method of boring a hole in the core 20, applying Cu plating to the hole side-surface, packing the filler 28b, and applying lid plating in sequence.

The laser vias 27 and the blind vias 28 are allocated at plural locations for example in a dot matrix shape in a planar view right under the heat generating element 30.

Here, the heat dissipation path 40 includes the electrically-conductive joining material 23a connected thermally-conductively and electrically-continuously, the one surface side electrode 23, the laser vias 27, the one surface side inner layer wire 25, the blind vias 28, and the other surface side inner layer wire 26. That is, the start point of the continuous heat dissipation path 40 is the electrically-conductive joining material 23a and the end point is the other surface side inner layer wire 26.

Thus, the structure is configured so as to directly connect the heat generating element 30 to the heat dissipation path 40 by directly connecting the heat generating element 30 to the electrically-conductive joining material 23a on the one surface 11 of the substrate 10. The heat of the heat generating element 30 is thereby transferred from the electrically-conductive joining material 23a to the other surface side inner layer wire 26 and dissipated. Further, the heat from the other surface side inner layer wire 26 is dissipated to the external heat dissipation member 60 through the other surface side insulating layer 22 and the other surface side electrode 24.

Further, since the heat generating element 30 is connected electrically to the heat dissipation path 40, the potential of the bottom surface of the heat generating element 30 touching the electrically-conductive joining material 23a is equalized to the potential of the other surface side inner layer wire 26 that is the end point of the heat dissipation path 40.

Here, the other surface 12 of the substrate 10 is provided by the other surface side insulating layer 22 having an electrical insulation property as stated above. The other surface side electrode 24 connected to the external heat dissipation member 60 is disposed on the surface of the other surface side insulating layer 22 right under the heat generating element 30, as shown in FIG. 1.

More specifically, as shown in FIG. 1, on the side of the other surface 12 of the substrate 10, the other surface side inner layer wire 26 that is the end point of the heat dissipation path 40 extends up to the inside of the other surface side insulating layer 22, and the other surface side insulating layer 22 is interposed between the other surface side inner layer wire 26 and the other surface side electrode 24. The other surface side inner layer wire 26 thereby is insulated electrically from the other surface side electrode 24.

In this way, according to the electronic device S1 of the present embodiment, the other surface side inner layer wire 26 that is the end point of the heat dissipation path 40 is not exposed to the other surface 12 of the substrate 10 by the other surface side insulating layer 22 and hence the potential of the bottom surface of the heat generating element 30 is also not exposed to the other surface 12 of the substrate 10 through the heat dissipation path 40. As a result, there is no problem even when the external heat dissipation member 60 is electrically conductive and it is possible to connect the other surface side electrode 24 to the heat dissipation member 60.

Further, since the other surface side electrode 24 is insulated electrically from the heat generating element 30, it is possible to adopt not only the electrically-insulative material but also an electrically-conductive material such as solder comparatively excellent in thermal conductivity as the thermally-conductive joining material 50 for thermally connecting the external heat dissipation member 60 to the other surface side electrode 24 as stated above.

In particular, the heat dissipation path 40 according to the present embodiment includes the one surface side inner layer wire 25 extending in the planar direction of the substrate 10 and being located on the side of the one surface 11 of the substrate 10, the other surface side inner layer wire 26 extending in the planar direction of the substrate 10 and being located on the side of the other surface 12 of the substrate 10, and the blind vias 28 connecting both the inner layer wires 25 and 26 to each other. As a result, it is possible to dissipate heat broadly not only in the direction right under the heat generating element 30 but also in the planar direction of the substrate 10.

Here, the substrate 10 according to the present embodiment can be manufactured by a typical laminated substrate manufacturing method of applying the processing of plating, boring, and others to the layers 20, 21, and 22 and stacking the layers 20, 21, and 22.

Second Embodiment

Figure 2:
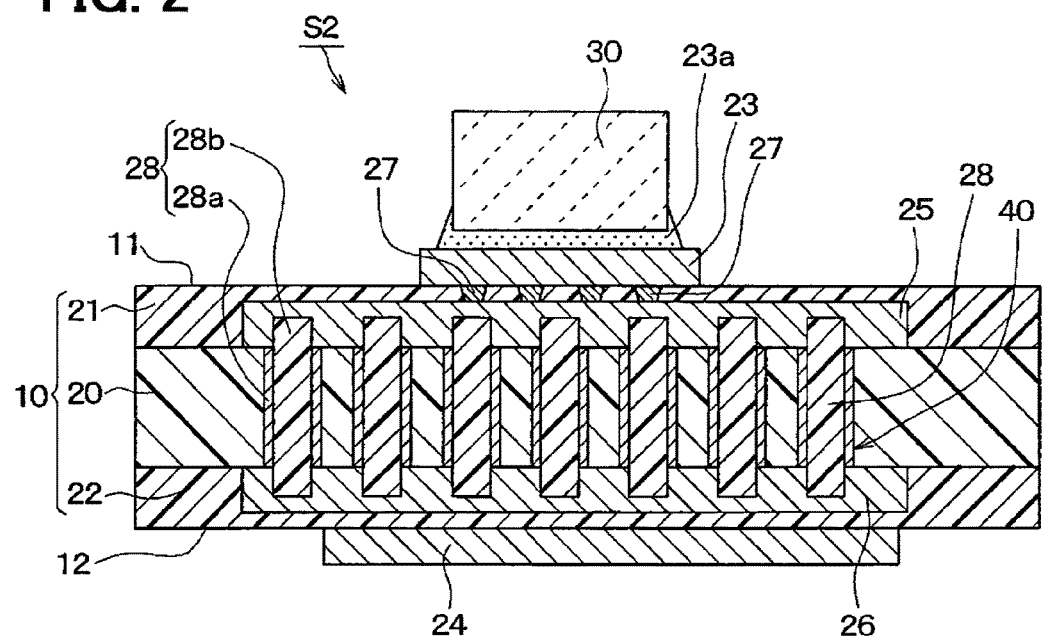
FIG. 2 is a schematic sectional view of an electronic device according to Second Embodiment of the present disclosure.

An electronic device S2 according to Second Embodiment of the present disclosure is described in reference to FIG. 2. In the present embodiment, the descriptions are focused mainly on differences from First Embodiment.

As shown in FIG. 2 in the present embodiment, the dimensions in the planar direction of the substrate 10 of the one surface side inner layer wire 25 and the other surface side inner layer wire 26 extending in the planar direction of the substrate 10 are increased further from First Embodiment in the interior of the substrate 10.

Although the dimensions of both the inner layer wires 25 and 26 in the planar direction of the substrate 10 are larger than the dimension of the heat generating element 30 in the planar direction of the substrate 10 to some extent also in First Embodiment, the extent is increased considerably in the present embodiment. According to the present embodiment, heat can be dissipated more broadly in the planar direction of the substrate 10.

Third Embodiment

Figure 3:
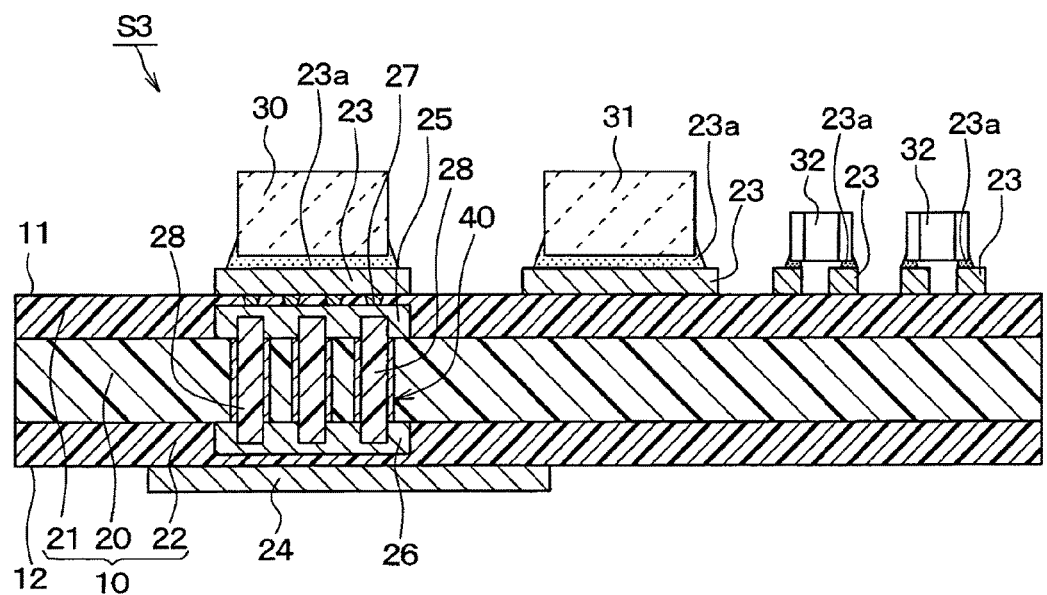
FIG. 3 is a schematic sectional view of an electronic device according to Third Embodiment of the present disclosure.

An electronic device S3 according to Third Embodiment of the present disclosure is described in reference to FIG. 3. In the present embodiment, the descriptions are focused mainly on differences from First Embodiment.

As shown in FIG. 3 in the present embodiment, in addition to the heat generating element 30, a control element 31 such as a microcomputer not requiring heat dissipation and passive elements 32 such as a resistance and a condenser are further mounted on the one surface 11 of the substrate 10.

Also in this case, it goes without saying that the function effect on the heat generating element 30 and the heat dissipation path 40 are the same as First Embodiment. Further, since the elements 31 and 32 not requiring heat dissipation are further mounted in addition to the heat generating element 30 in the present embodiment, the present embodiment can be applied in combination with Second Embodiment.

Fourth Embodiment

Figure 4:
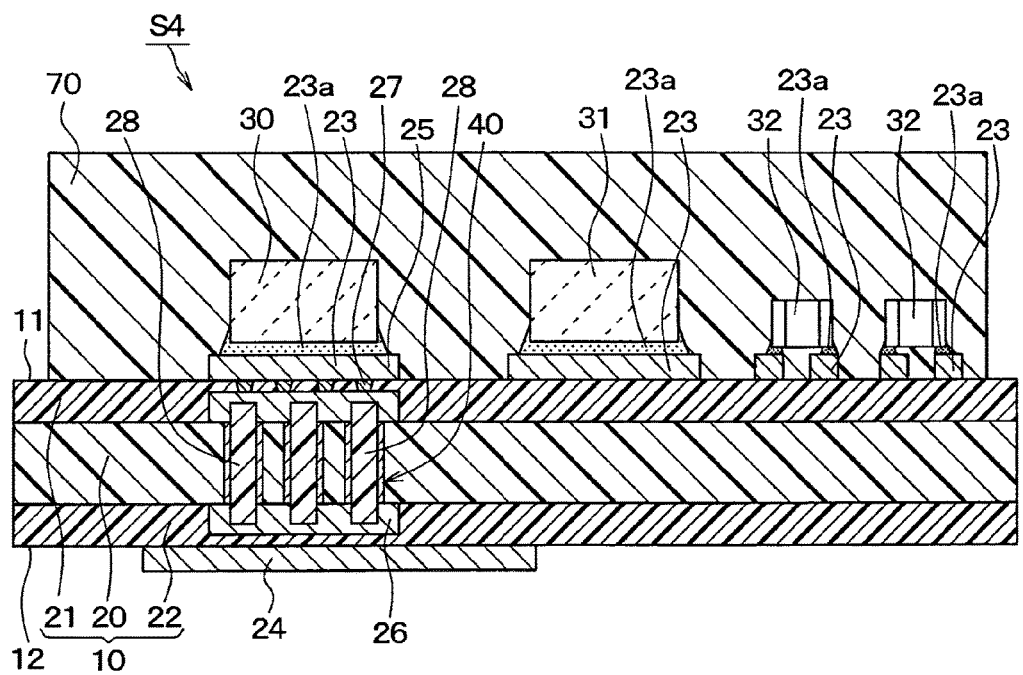
FIG. 4 is a schematic sectional view of an electronic device according to Fourth Embodiment of the present disclosure.

An electronic device S4 according to Fourth Embodiment of the present disclosure is described in reference to FIG. 4. As shown in FIG. 4, the present embodiment represents a half-mold structure of sealing the one surface 11 of the substrate 10 and parts mounted over the one surface 11 with a molding resin 70 and exposing the other surface 12 of the substrate 10 from the molding resin 70.

According to the structure, the mounted parts and the joints are protected on the side of the one surface 11 of the substrate 10 and the side of the other surface 12 of the substrate 10 is exposed and is suitable for heat dissipation. Here, since only the molding resin 70 is added in the present embodiment, the present embodiment can be applied in combination with the above embodiments.

Fifth Embodiment

Figure 5:
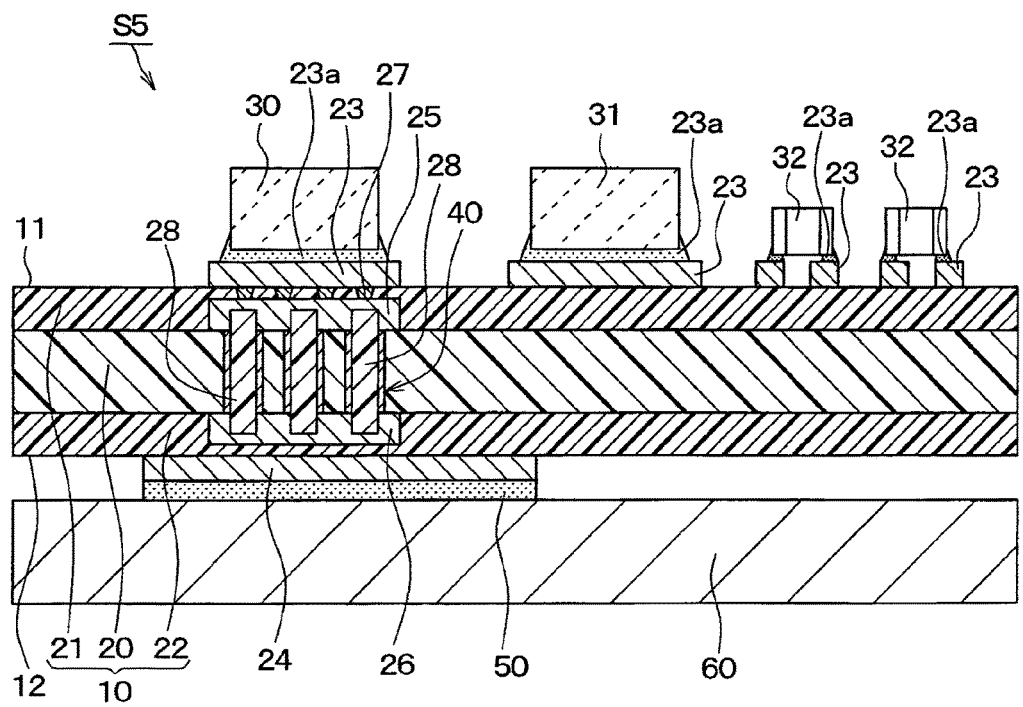
FIG. 5 is a schematic sectional view of an electronic device according to Fifth Embodiment of the present disclosure.

An electronic device S5 according to Fifth Embodiment of the present disclosure is described in reference to FIG. 5. As shown in FIG. 5, the electronic device S5 according to the present embodiment is the same as the electronic device S3 shown in Third Embodiment. The present embodiment provides the state of connecting the electronic device S5 to an external heat dissipation member 60 with the thermally-conductive joining material 50 interposed.

Sixth Embodiment

Figure 6A:
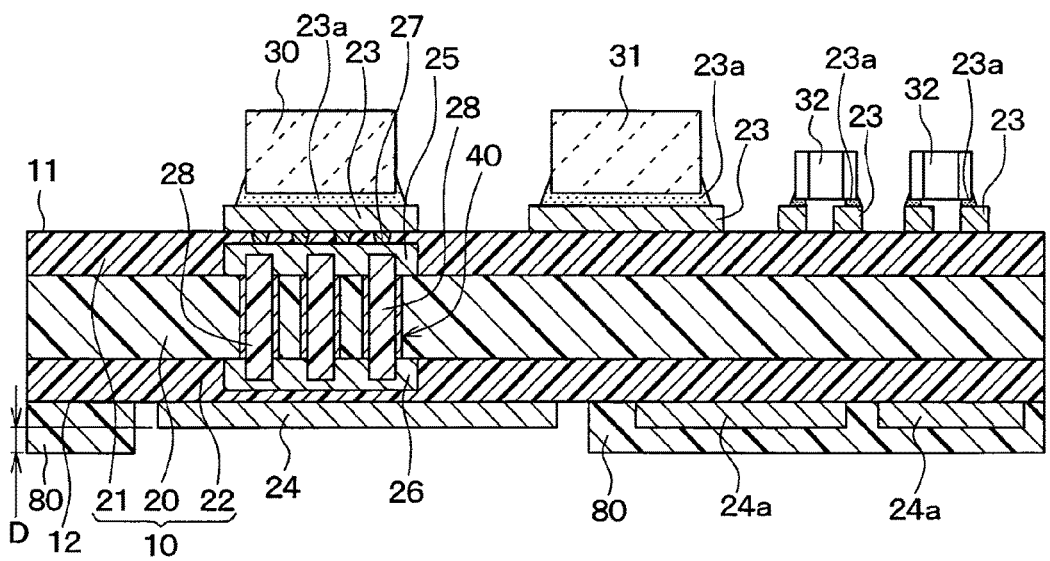
FIG. 6A is a schematic sectional view of an electronic device according to Sixth Embodiment of the present disclosure and shows the state before it is sealed with a molding resin.
Figure 6B:
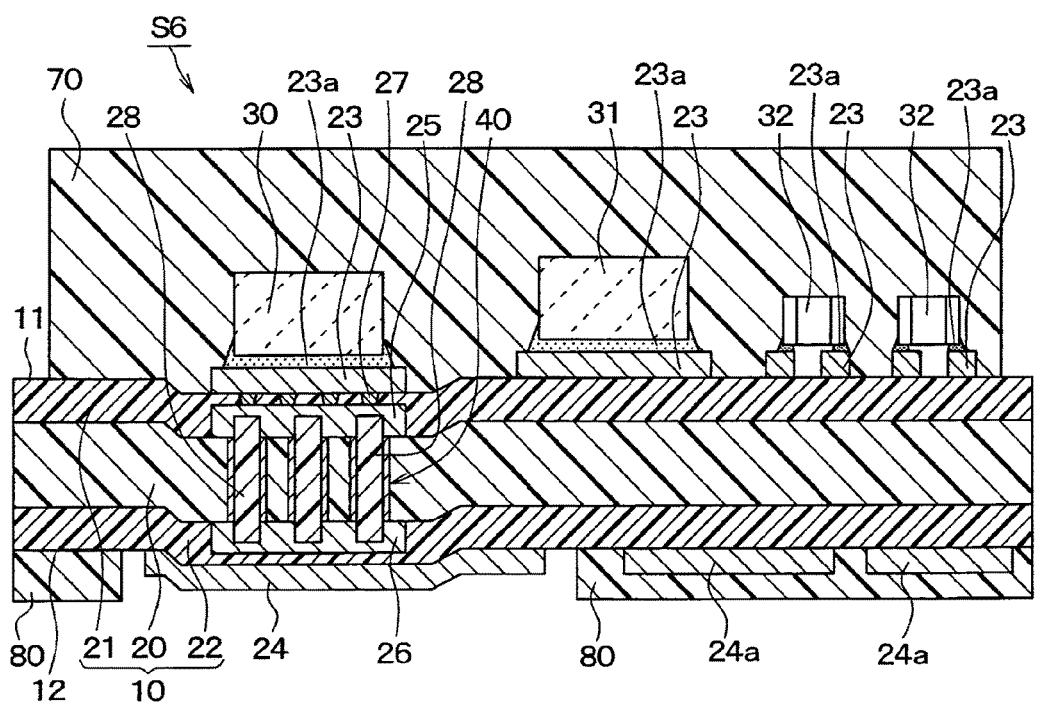
FIG. 6B is a schematic sectional view of an electronic device according to Sixth Embodiment and shows a finished state after it is sealed with a molding resin.

An electronic device S6 according to Sixth Embodiment of the present disclosure is discussed in reference to FIGS. 6A and 6B. As shown in FIG. 6B, the electronic device S6 is different from the electronic device S4 (refer to FIG. 4) according to Fourth Embodiment on the point that a solder resist film 80 is added and a part of the substrate 10 bends and deforms and the descriptions are focused on the difference.

Also in the present embodiment, the substrate 10 is made of a resin such as an epoxy resin. Further, similarly to Fourth Embodiment, the half-mold structure of forming the molding resin 70 to seal the heat generating element 30 and the one surface 11 of the substrate 10 on the side of the one surface 11 of the substrate 10 and exposing the other surface 12 of the substrate 10 from the molding resin 70 is provided.

Here, as shown in FIG. 6B, the solder resist film 80 to cover and protect the other surface 12 of the substrate 10 is disposed on the other surface 12 of the substrate 10. The solder resist film 80: covers and protects an other surface side wire 24a that is a circuit constituting conductor disposed on the other surface 12 of the substrate 10 and others; and is made of an ordinary solder resist material.

The solder resist film 80 is arranged around the other surface side electrode 24 located right under the heat generating element 30 while the other surface side electrode 24 is exposed. Further, the solder resist film 80 is thicker than the other surface side electrode 24.

As shown in FIG. 6B, the portion of the substrate 10 right under the heat generating element 30 bends so that the one surface 11 of the substrate 10 is recessed and the other surface 12 of the substrate 10 is projected. The center of the other surface side electrode 24 thereby protrudes from the periphery thereof at a level not exceeding the surface of the solder resist film 80.

The bend of the substrate 10 is given by a molding pressure added to the side of the one surface 11 of the substrate 10 when sealing is applied with the molding resin 70. As stated above, the solder resist film 80 is thicker than the other surface side electrode 24.

As a result, before sealing is applied with the molding resin 70, as shown in FIG. 6A, the solder resist film 80 protrudes more than the other surface side electrode 24 and a level difference D exists between them.

The sealing with the molding resin 70 is carried out by putting the work shown in FIG. 6A into a die and applying resin molding. In this case, on the side of the other surface 12 of the substrate 10, the work is supported by the surface of the solder resist film 80 touching the die but the other surface side electrode 24 is in the state of being separated away from the die because of the level difference D.

When the die is filled with the molding resin 70 in the state, the side of the one surface 11 of the substrate 10 is pressed by the pressure (molding pressure) of the resin 70 and hence the substrate 10 bends and deforms at the part where the other surface side electrode 24 is separated away from the die.

As a result of that, the electronic device S6 according to the present embodiment shown in FIG. 6B is obtained. Here, since the substrate 10 bends by the mechanism, the level of the protrusion in the center of the other surface side electrode 24 is a level equal to or less than the surface of the solder resist film 80.

In this way, according to the present embodiment, the substrate 10 bends and the center of the other surface side electrode 24 protrudes so as to fill as much as possible the level difference D formed between the other surface side electrode 24 and the solder resist film 80 because the solder resist film 80 is thicker.

As a result, according to the present embodiment, when the other surface side electrode 24 is connected to the external heat dissipation member 60 with the thermally-conductive joining material 50 such as solder interposed, it is possible to reduce to the utmost the thickness of the thermally-conductive joining material 50 to the extent corresponding to the protrusion of the other surface side electrode 24. As a result, the effects of reducing the quantity of the used thermally-conductive joining material 50 and inhibiting the thermal resistance caused by the thermally-conductive joining material 50 from increasing can be expected.

Here, since the solder resist film 80 is disposed on the other surface 12 of the substrate 10 and the part of the substrate 10 corresponding to the other surface side electrode 24 exposed from the solder resist film 80 bends in the present embodiment, the present embodiment can be applied in combination with the above embodiments except Fourth Embodiment.

Seventh Embodiment

Figure 7:
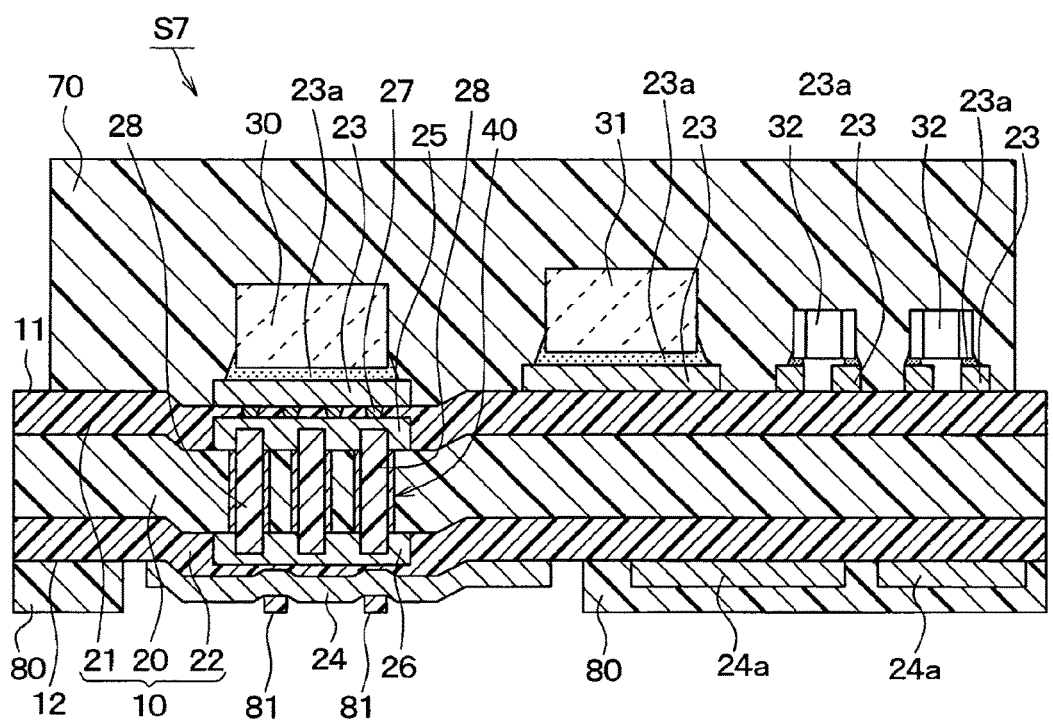
FIG. 7 is a schematic sectional view of an electronic device according to Seventh Embodiment of the present disclosure.
Figure 8A:
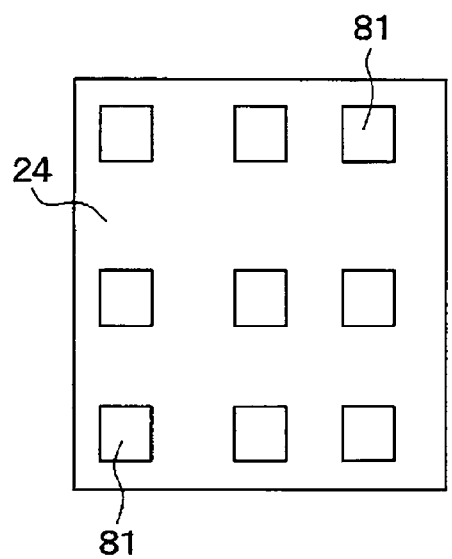
FIG. 8A is a schematic plan view showing a first example of an other surface electrode section in the electronic device shown in FIG. 7.
Figure 8B:
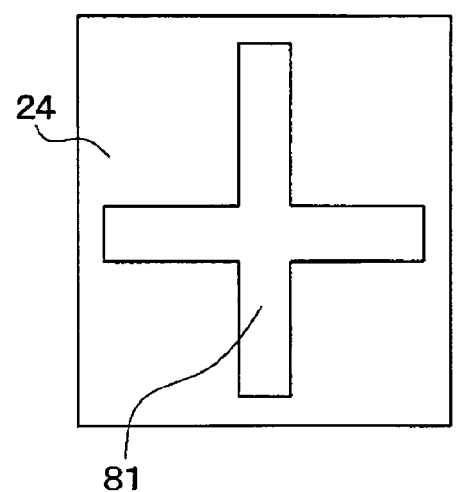
FIG. 8B is a schematic plan view showing a second example of an other surface electrode section in the electronic device shown in FIG. 7.

An electronic device S7 according to Seventh Embodiment of the present disclosure is described in reference to FIGS. 7, 8A and 8B. As shown in FIGS. 7, 8A and 8B, the electronic device S7 is configured by further forming a solder resist film 81 partially over the surface of the other surface side electrode 24 of the electronic device S6 according to Sixth Embodiment (refer to FIG. 6B).

The solder resist film 81 is formed with the same material as the solder resist film 80 but is referred to as a partial resist film 81 in order to distinguish it from the solder resist film 80. The planar shape of the partial resist film 81 may be any shape as long as it exists partially on the other surface side electrode 24 and may be a dot shape as shown in FIG. 8A, a lattice shape as shown in FIG. 8B, or another shape.

When the molding resin 70 is applied for sealing in the same manner as Sixth Embodiment in the state of forming the partial resist film 81, the bend of the substrate 10 is restricted at the part of the partial resist film 81. In this way, the partial resist film 81 restricts the substrate 10 from bending and the effect of preventing damage caused by excessive bending from occurring in the substrate 10 is expected.

In the following embodiments, the descriptions are focused mainly on differences from the above embodiments although the embodiments duplicate somewhat with the above embodiments.

Eighth Embodiment

Figure 9:
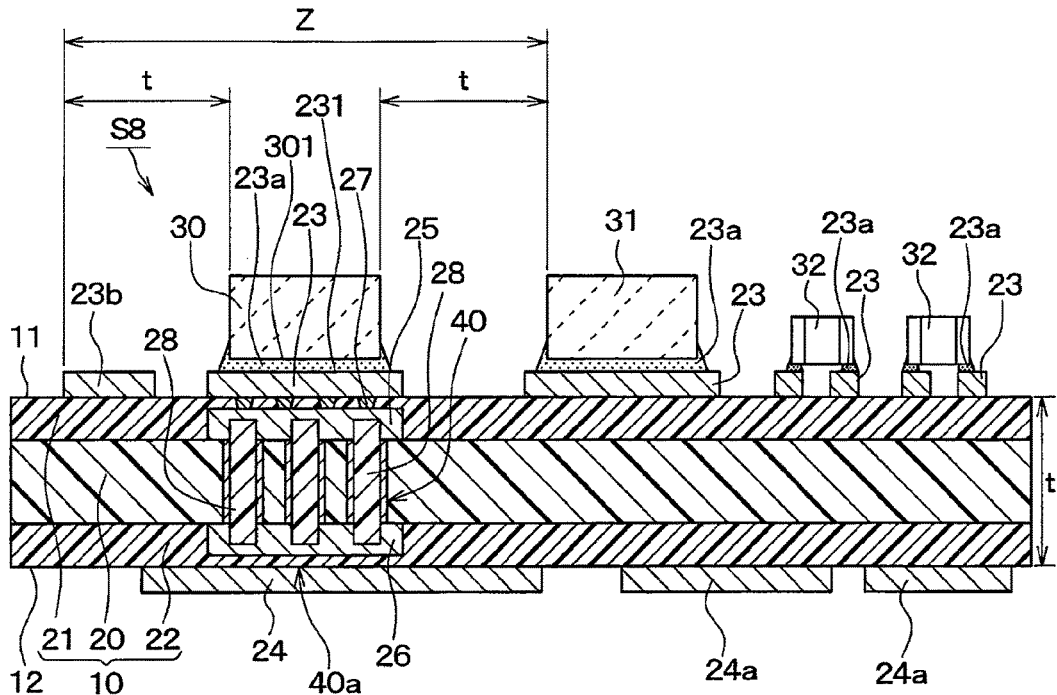
FIG. 9 is a schematic sectional view of an electronic device according to Eighth Embodiment of the present disclosure.

An electronic device S8 according to Eighth Embodiment of the present disclosure is described in reference to FIG. 9. The electronic device S8 according to the present embodiment also roughly includes the substrate 10, the heat generating element 30 mounted on the one surface 11 of the substrate 10, and the electrically-conductive heat dissipation path 40 being disposed in the substrate 10 and dissipating the heat generated in the heat generating element 30 to the side of the other surface 12 of the substrate 10.

In the present embodiment, the substrate 10 has the one surface 11 on the top and the other surface 12 on the bottom and includes the electrically-insulative three layers 20 to 22, namely is configured by stacking the one surface side insulating layer 21, the core 22 as a core layer, and the other surface side insulating layer 22. Also in the substrate 10, the surface of the one surface side insulating layer 21 corresponds to the one surface 11 of the substrate 10 and the surface of the other surface side insulating layer 22 corresponds to the other surface 12 of the substrate 10. More specifically, the one surface side insulating layer 21 and the other surface side insulating layer 22 correspond to a one surface side substrate insulating layer and an other surface side substrate insulating layer, those being parts of the substrate, respectively.

Here, the one surface side electrode 23 and the one surface side wire 23b are disposed on the one surface 11 of the substrate 10. The one surface side electrode 23 is provided as a land on which the heat generating element 30 is mounted, namely a one surface side land, and the one surface side wire 23b is made of Cu or the like and is provided as a circuit constituting conductor. The one surface side electrode 23, together with the one surface side wire 23b, is patterned into prescribed shapes by etching, printing, or the like. Here, both the one surface side electrode 23 and the one surface side wire 23b are electrically conductive.

Further, over the one surface 11 of the substrate 10, other elements 31 and 32 such as the control element 31 and the passive elements 32 are mounted together with the heat generating element 30. The elements 30 to 32 are mounted on the one surface side electrode 23 as the one surface side land used for mounting the elements. The heat generating element 30 is an element, such as a power transistor or an IGBT, to generate heat when it is driven and more specifically is a vertical element having a rear electrode or the like. Further, the heat generating element 30 includes an ordinary packaged heat generating part.

Also in the present embodiment, similarly to above, the electrically-conductive heat dissipation path 40 to dissipate the heat generated in the heat generating element 30 to the side of the other surface 12 of the substrate 10 is disposed in the interior of the substrate 10 right under the heat generating element 30. That is, the heat dissipation path 40 is located at a position in the direction of projecting the heat generating element 30 on the one surface 11 of the substrate 10, namely right under the heat generating element 30, and extends continuously from the side of the one surface 11 to the side of the other surface 12 of the substrate 10.

The heat generating element 30 is joined directly to the one surface side electrode 23 with the electrically-conductive joining material 23a interposed on the one surface of the substrate 10. Here, the one surface side electrode 23 and the electrically-conductive joining material 23a are the start point of the heat dissipation path 40, and the start point of the heat dissipation path 40 is connected directly to the heat generating element 30 by the direct joint between the heat generating element 30 and the one surface side electrode 23.

Further, the one surface side electrode 23 as a one surface side land exists in the whole area of the heat generating element 30 projected to the one surface 11 of the substrate 10 right under the heat generating element 30. That is, the one surface side electrode 23: does not have a chipped part caused by a hole or the like in the region overlapping with the whole projected area of the heat generating element 30; but overlaps with the whole projected area of the heat generating element 30.

In addition to that, the dimension of the one surface side electrode 23 in the planar direction of the substrate 10 is larger than the dimension of the heat generating element 30 in the planar direction of the substrate 10. Although it is not in a limited way, when the heat generating element 30 has a rectangular shape in a planar view for example, the one surface side electrode 23 has a rectangular shape slightly larger than that in a planar view.

Further, the other surface side insulating layer 22 is a layer having an electrical insulation property and constituting the side of the other surface 12 of the substrate 10 as a part of the substrate 10. That is, the other surface side insulating layer 22 is disposed on the whole of the substrate 10 in the planar direction of the substrate 10 on the side of the other surface 12 of the substrate 10 and configured as a part of the substrate 10. As a result, the surface of the other surface side insulating layer 22 is the other surface 12 of the substrate 10 in the same manner as above.

More specifically, it can be said that the substrate 10 is the electrically-insulative substrate having the laminated construction of the electrically-insulative core 20 and the electrically-insulative other surface side insulating layer 22 stacked on the core 20 on the side of the other surface 12 of the substrate 10.

Here, an electrically-conductive other surface side electrode 24 is disposed on the other surface 12 of the substrate 10, namely on the surface of the other surface side insulating layer 22, right under the heat generating element 30. The other surface side electrode 24 functions as an other surface side land to dissipate heat to the exterior by being connected to the heat dissipation member 60 or the like.

Further, the other surface side wire 24a being made of Cu or the like and being configured as a circuit constituting conductor is disposed on the other surface 12 of the substrate 10. Here, more specifically, the other surface side electrode 24, together with the other surface side wire 24a, is patterned into a prescribed shape by etching, printing or the like.

The other surface side electrode 24 is electrically independent from the other surface side wire 24a. That is, as stated above, the other surface side electrode 24 is electrically independent from all the electrically-conductive elements other than itself in the substrate 10 and is at the GND potential by a body earth or the like. Here, in the present embodiment, the other surface side electrode 24 may be electrically independent from a part of the other surface side wire 24a.

The end point of the heat dissipation path 40 extends up to the other surface side insulating layer 22 on the side of the other surface 12 of the substrate 10. The end point of the heat dissipation path 40 is the other surface side inner layer wire 26 as a thermal diffusion layer. Here, the thermal diffusion layer has the function of dispersing heat not only in the thickness direction but also in the planar direction of the substrate 10. The other surface side inner layer wire 26 extends in the planar direction of the substrate 10 and hence functions as the thermal diffusion layer.

The other surface side insulating layer 22 that is a part of the substrate 10 is interposed between the other surface side inner layer wire 26 and the other surface side electrode 24, and the other surface side inner layer wire 26 is insulated electrically from the other surface side electrode 24. A thermal diffusion insulating section 40a thereby includes the other surface side inner layer wire 26, the other surface side electrode 24, and the other surface side insulating layer 22 interposed between them. Here, as shown in FIG. 9, in the other surface side insulating layer 22, the portion corresponding to the other surface side inner layer wire 26 is thinner than the remaining portion.

Further, in the thermal diffusion insulating section 40a, both the other surface side inner layer wire 26 and the other surface side electrode 24 are located right under the heat generating element 30 and exist over the whole area of the heat generating element 30 projected to the one surface 11 of the substrate 10 right under the heat generating element 30.

Furthermore, the dimensions of the other surface side inner layer wire 26 and the other surface side electrode 24 in the planar direction of the substrate 10 are larger than the dimension of the heat generating element 30 in the planar direction of the substrate 10. In the thermal diffusion insulating section 40a in this way, the heat dissipation path 40 is not exposed to the other surface 12 of the substrate 10, insulation is secured, and heat is dissipated in the planar direction of the substrate 10 on the side of the other surface 12. Although it is not in a limited way, when the heat generating element 30 has a rectangular shape in a planar view, for example, the other surface side inner layer wire 26 and the other surface side electrode 24 have rectangular shapes slightly larger than that in a planar view.

More specifically, in the present embodiment, the heat generating element 30 has a joining plane (the lower plane of the heat generating element in FIG. 9) 301 to be joined electrically to the one surface side electrode 23 as the one surface side land. In contrast, the one surface side electrode 23 has a joined plane (the upper plane of the one surface side electrode in FIG. 9) 231 to be joined electrically to the heat generating element 30.

The joined plane 231 exists at least over the whole region of the joining plane 301 projected in the thickness direction of the substrate 10 and the structure is configured so as to have an electrically-conductive joining material 23*a* to directly join the joining plane 301 to the joined plane in the whole projected region. Further, although the joining plane 231 is defined as the whole region of the lower plane of the heat generating element 30 in the embodiment shown in FIG. 9, the present embodiment is not limited to the case. For example, in the case of a heat generating element having a plurality of divided joining planes, it is acceptable as long as the joined planes corresponding to the plural joining planes exist over the whole projected region of the joining planes. Further, although the joined plane 231 is larger than the planar size of the heat generating element 30 in the embodiment shown in FIG. 9, the present embodiment is not limited to the case. An embodiment in which the planar size of the joined plane is smaller than the planar size of the heat generating element is also acceptable. In other words, the total area of the joined plane 231 may be larger than the total area of the joining plane 301 and either smaller or larger than the area of the heat generating element in the planar direction of the substrate 10.

Further, in the thermal diffusion insulating section 40*a* stated above, both the other surface side inner layer wire 26 and the other surface side electrode 24 are located right under the heat generating element 30 and exist over the whole projected area of the heat generating element 30. In addition to that, with regard to the dimensions in the planar direction of the substrate 10, the dimensions of the other surface side inner layer wire 26 and the other surface side electrode 24 are larger than that of the heat generating element 30. The thermal diffusion insulating section 40*a* according to the present embodiment, however, is not limited to the configuration and may have the following configuration.

Here, as shown in FIG. 9, a region obtained by expanding the planar size of the heat generating element 30 in the planar direction of the substrate 10 from the heat generating element 30 further toward the outside by the extent corresponding to the thickness t of the substrate 10 at the whole periphery of the heat generating element 30 is defined as a heat dissipation contributing region Z.

The heat of the heat generating element 30 diffuses in the direction of about 45° from the side of the one surface 11 of the substrate 10 to the side of the other surface 12. Consequently, the thermal diffusion in the substrate 10 is carried out in the region expanding by the extent roughly corresponding to the thickness t of the substrate 10 from the heat generating element 30. Consequently, the region is defined as the heat dissipation contributing region Z to contribute to heat dissipation.

In this case, in the thermal diffusion insulating section 40*a* according to the present embodiment, the other surface side insulating layer 22 is interposed between the other surface side inner layer wire 26 and the other surface side electrode 24 in the heat dissipation contributing region Z and electrically insulates the other surface side inner layer wire 26 from the other surface side electrode 24.

In addition, in the thermal diffusion insulating section 40*a*, at least a part of the other surface side inner layer wire 26 and at least a part of the other surface side electrode 24 constitute a thermal diffusion layer pair having a total area larger than the area of the heat generating element 30 in the planar direction of the substrate 10 in the heat dissipation contributing region Z. The thermal diffusion insulating section 40*a* made of the other surface side inner layer wire 26, the other surface side electrode 24, and the other surface side insulating layer 22 is thereby disposed on the side of the other surface 12 of the substrate 10.

The thermal diffusion insulating section 40*a* is acceptable as long as the whole or parts of the other surface side inner layer wire 26 and the other surface side electrode 24 is/are in the heat dissipation contributing region Z and the total area described above means the total area of the parts existing in the heat dissipation contributing region Z. That is, the other surface side inner layer wire 26 and the other surface side electrode 24 may not necessarily be located in the projected region of the heat generating element 30 namely right under the heat generating element 30 as long as they are located in the heat dissipation contributing region Z and may also have grooves.

Incidentally, according to the present embodiment, in the same manner as stated in First Embodiment, the other surface side inner layer wire 26 that is the end point of the heat dissipation path 40 is not exposed to the other surface 12 of the substrate 10 by the other surface side insulating layer 22 constituting the other surface 12 of the substrate 10. Consequently, it is possible to appropriately dissipate heat on the side of the other surface 12 of the substrate 10 without the potential of the heat generating element 30 on the side of the one surface 11 of the substrate 10 exposed to the side of the other surface 12 of the substrate 10 through the heat dissipation path 40.

Further, the effects of the present embodiment are described in detail. In the present embodiment, since the heat of the heat generating element 30 is transferred short of the other surface side insulating layer 22, diffuses in the planar direction of the substrate 10 through the other surface side insulating layer 22, and is dissipated at the other surface side electrode 24, the heat dissipation property improves.

Further, since the insulation property is secured by the other surface side insulating layer 22 that is a part of the substrate 10, the downsizing and the production of the substrate 10 are excellently facilitated and the insulation property is secured easily in comparison with the case of separately forming an insulating layer or the like in the substrate 10.

Further, the heat generating element 30 is joined directly to the one surface side electrode 23 that is the start point of the heat dissipation path 40 with the electrically-conductive joining material 23*a* interposed. As a result, it is possible for example to restrict the heat of the heat generating element 30 from being stored on the side of the one surface 11 of the substrate 10 because a metal body such as a heat spreader is interposed. That is, the heat of the heat generating element 30 is transferred to the side of the other surface 12 through the heat dissipation path, dispersed in the planar direction of the substrate 10 on the side of the other surface 12, and dissipated. As a result, it is possible to restrict the heat of the heat generating element 30 from interfering with the other elements 31 and 32 mounted on the one surface 11 of the substrate 10.

Further, the one surface side electrode 23 exists over the whole projected area of the heat generating element 30 and the planar size thereof is larger than that of the heat generating element 30. Further, the joined plane 231 exists at least over the whole region of the joining plane 301 projected in the thickness direction of the substrate 10 and the electronic device is configured so as to have the electrically-conductive joining material 23a to directly join the joining plane 301 to the joined plane 231 over the whole projected region. By the configuration, it is possible to equalize the temperature distribution of the heat generating element 30 and avoid local stress concentration to the heat generating element 30 while the heat dissipation property to the side of the other surface 12 of the substrate 10 is secured. Further, since the electrically-conductive joining material 23a exists over the whole projected region of the joining plane 301, it is possible to transfer the whole heat from the joining plane 301 to the heat dissipation path having the electrically-conductive joining material 23a as the start point.

Further, in the example shown in FIG. 9, both the other surface side inner layer wire 26 and the other surface side electrode 24 paired therewith also exist over the whole projected area of the heat generating element 30 and the planar sizes are larger than that of the heat generating element 30. As a result, it is possible to disperse heat over a wide region with the other surface side insulating layer 22 interposed on the side of the other surface 12 of the substrate 10 and that is favorable to the improvement of heat dissipation property.

Further, as stated above, the joined plane 231 exists over the whole region of the joining plane 301 projected in the thickness direction of the substrate 10 and the electrically-conductive joining material 23a directly joins the joining plane 301 to the joined plane 231 over the whole projected region. The joint region by the electrically-conductive joining material 23a largely influences the heat dissipation to the bottom surface of the heat generating element 30, namely to the joining plane 301 and, when a non-joined region exists, the heat dissipation property is very poor. For example, in the case of a through-hole type joint, a region not joined tends to be formed and the heat dissipation property is likely to be inferior but such problems can be avoided in the present embodiment.

The specific features of the heat dissipation path 40 according to the present embodiment are described further. The heat dissipation path 40, in the same manner as the above embodiments, has the one surface side inner layer wire 25 extending in the planar direction of the substrate 10 and being located in the interior of the substrate 10 on the side of the one surface 11 of the substrate 10 and blind vias 28 extending in the thickness direction of the substrate 10 and connecting the one surface side inner layer wire 25 to the other surface side inner layer wire 26. As a result, it is possible to spread and release heat in the planar direction of the substrate 10 by the inner layer wires 25 and 26 extending in the planar direction of the substrate 10.

The heat dissipation path 40 further has the laser vias 27 extending in the thickness direction of the substrate 10 and connecting the one surface side electrode 23 to the one surface side inner layer wire 25. Here, the one surface side inner layer wire 25 and the other surface side inner layer wire 26 are disposed between the one surface side insulating layer 21 and the core 20 and between the core 20 and the other surface side insulating layer 22 respectively in the same manner as described above. In this way, the heat dissipation path 40 includes the sections 23a, 23, 27, 25, 28, and 26 in the order from the start point in the same manner as described above.

Further, the laser vias 27 and the blind vias 28 pass through the one surface side insulating layer 21 and the core 20 respectively in the same manner as described above. Then the inner layer wires 25 and 26 are formed by being integrated with the lid plating of the vias 27 and 28 respectively.

Here, it is desirable that the laser vias 27 and the blind vias 28 do not overlap with each other and are located at separate positions in the planar direction of the substrate 10 from the viewpoint of heat dissipation property. As shown in FIG. 9, the part of the one surface side inner layer wire 25 where the blind vias 28 are located is the part corresponding to the lid plating of the blind vias 28 and is thinner than the part other than the blind vias 28.

If the blind vias 28 exist right under the laser vias 27, the laser vias 27 are connected to the thinner part of the one surface side inner layer wire 25 and the transient thermal resistance increases. In that regard, there is the advantage that the transient thermal resistance reduces by connecting the laser vias 27 to the thick part of the one surface side inner layer wire 25 located at a position deviated from the blind vias 28. Here, although some of the blind vias 28 exist right under some of the laser vias 27 and the vias are located at positions overlapping with each other in FIG. 9, it goes without saying that all the laser vias 27 and all the blind vias 28 may not overlap with each other and may be located at separate positions.

Further, also in the present embodiment, it is desirable that the one surface side inner layer wire 25 exists over the whole area of the heat generating element 30 projected to the one surface 11 of the substrate 10 right under the heat generating element 30. In addition to that, it is desirable that the dimension of the one surface side inner layer wire 25 in the planar direction of the substrate 10 is larger than the dimension of the heat generating element 30 in the planar direction of the substrate 10. This is based on the same reason as the dimensional relationship of the one surface side electrode 23, the other surface side inner layer wire 26, and the other surface side electrode 24 to the heat generating element 30 as stated above.

Here, as the heat generating element 30, in addition to a vertical element or the like stated above, for example a passive element such as a resistance element or a coil element may also be used as long as it is an element requiring dissipating heat generated during drive.

Further, although it is not shown in FIG. 9, it goes without saying that, as shown in FIG. 1 or the like, the heat dissipation member 60 may be connected to the other surface side electrode 24 with the thermally-conductive joining material 50 or the like interposed, also in the present embodiment. Here, as the thermally-conductive joining material 50, a heat dissipation gel, a heat dissipation sheet, an electrically-conductive adhesive containing a metal filler, and the like are named in addition to thermal grease, solder, and silver paste.

Here, it goes without saying that Eighth Embodiment can be combined appropriately with First to Seventh Embodiments in an allowable range.

Ninth Embodiment

Figure 10:
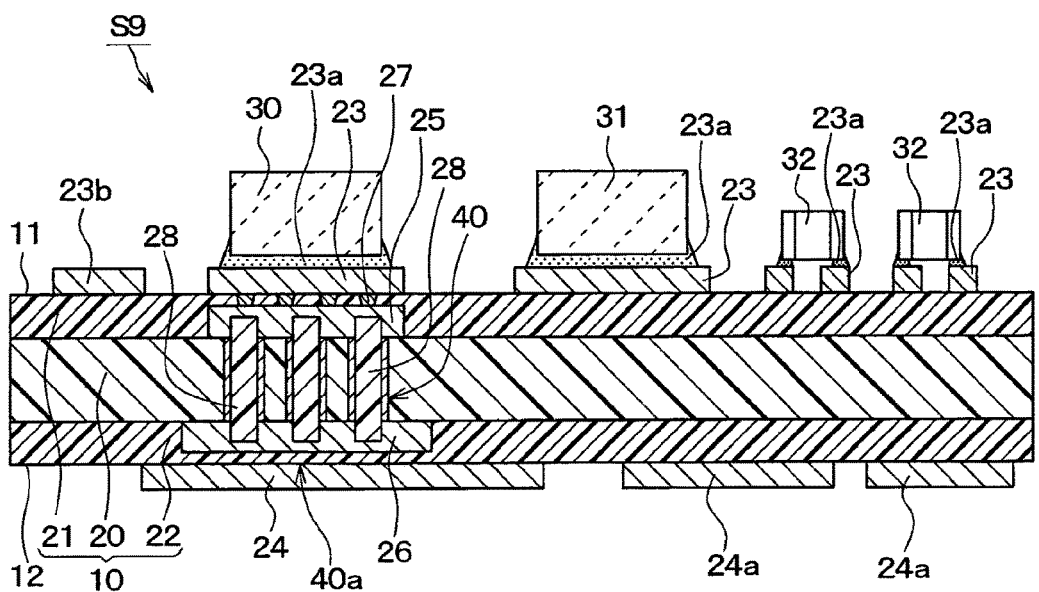
FIG. 10 is a schematic sectional view of an electronic device according to Ninth Embodiment of the present disclosure.

An electronic device S9 according to Ninth Embodiment of the present disclosure is described in reference to FIG. 10. In the present embodiment, a part of Eighth Embodiment is modified and the descriptions in the present embodiment are focused on the modified part.

As shown in FIG. 10, the dimensions of the one surface side electrode 23 and the one surface side inner layer wire 25 in the planar direction of the substrate 10, namely the planar sizes, are identical. Further, the respective dimensions of the other surface side inner layer wire 26 and the other surface side electrode 24 in the planar direction of the substrate 10 are larger than the respective dimensions of the one surface side electrode 23 and the one surface side inner layer wire 25 in the planar direction of the substrate 10.

As a result, in heat dissipation in the direction from one surface 11 to the other surface 12 of the substrate 10, namely in the thickness direction of the substrate 10, the heat diffuses in the planar direction of the substrate 10 as the heat is transferred toward the side of the other surface 12. In particular, the heat diffuses conspicuously around the other surface side insulating layer 22 and the improvement of heat dissipation efficiency can be expected. Consequently, the heart dissipation path 40 that is preferable from the viewpoint of heat dissipation property can be materialized.

Here, with regard to the dimensions of the other surface side inner layer wire 26 and the other surface side electrode 24 in the planar direction of the substrate 10, either they may be identical or the other surface side inner layer wire 26 may be larger. As shown in FIG. 10 and the figures of the above embodiments however, it is desirable that the dimension of the other surface side electrode 24 in the planar direction of the substrate 10 is larger than the dimension of the other surface side inner layer wire 26 in the planar direction of the substrate 10 from the viewpoint of improving the heat dissipation property. This is based on the fact that the heat dissipation can be advanced on the side of the other surface 12 of the substrate 10 as stated above.

Here, since the present embodiment stipulates the planar sizes of the sections in the heat dissipation path 40 and the other surface side electrode 24 as stated above, it is a matter of course that the present embodiment can be combined appropriately with the above embodiments with the relationship of the planar sizes maintained.

Tenth Embodiment

Figure 11:
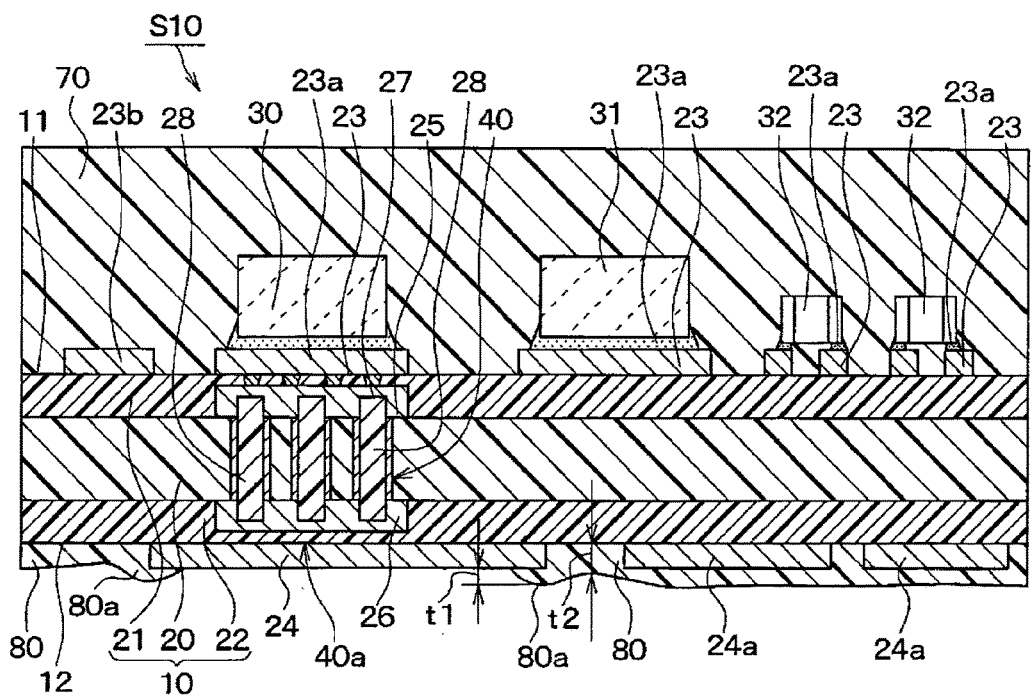
FIG. 11 is a schematic sectional view showing a substantial part of an electronic device according to Tenth Embodiment of the present disclosure.

An electronic device S10 according to Tenth Embodiment of the present disclosure is described in reference to FIG. 11 while the descriptions are focused mainly on the differences from Eighth Embodiment. As shown in FIG. 11, the present embodiment is based on a half-mold structure similarly to FIG. 6B.

That is, the layers 20 to 22 of the substrate 10 are made of a resin, and the molding resin 70 to seal the heat generating element 30, the other elements 31 and 32, the one surface side wire 23b, and the one surface 11 of the substrate 10 is disposed on the side of the one surface 11 of the substrate 10. Further, the other surface 12 of the substrate 10 is exposed from the molding resin 70.

Further, the solder resist film 80 to cover and protect the other surface 12 of the substrate 10 is disposed on the other surface 12 of the substrate 10. In this case, the solder resist film 80 is arranged around the other surface side electrode 24 in the manner of covering the periphery of the other surface side electrode 24 while the other surface side electrode 24 is exposed.

Then, a covering section 80a of the solder resist film 80 to cover the periphery of the other surface side electrode 24 is thinner than the portion of the solder resist film 80 located on the other surface 12 of the substrate 10 around the other surface side electrode 24. Concretely, in FIG. 11, the thickness t1 of the covering section 80a is smaller than the thickness t2 of the portion of the solder resist film located on the other surface 12 of the substrate 10 around the other surface side electrode 24.

By the configuration, it is possible to reduce the level difference caused by the solder resist film 80 between the other surface side electrode 24 and the other surface 12 of the substrate 10 around the other surface side electrode 24. As a result, in the same manner as Sixth Embodiment (refer to FIG. 6B), it is possible to reduce the deformation of the substrate 10 caused by molding pressure applied when the molding resin 70 is formed and mitigate damage to the substrate 10. Meanwhile, the shape of a part of the solder resist film 80 located between the covering section 80a and the portion located on the other surface 12 of the substrate 10 around the other surface side electrode 24 is not particularly limited.

As shown in FIG. 11 however, it is further desirable that the thickness of the portion of the solder resist film 80 located between the covering section 80a and the part located on the other surface 12 of the substrate 10 around the other surface side electrode 24 varies so as to form a tapered shape. Since the level difference at the part can be eliminated to the extent possible and a gentle tapered shape can be formed thereby, the molding pressure of the molding resin 70 is likely to be mitigated.

In the present embodiment, as shown in FIG. 11 similarly to FIG. 9 and others, the other surface side wire 24a is disposed apart from the other surface side electrode 24 at a portion adjacent to the other surface side electrode 24 over the other surface 12 of the substrate 10. The solder resist film 80 is arranged continuously from around the other surface side electrode 24 to the covering section 80a while covering the other surface side wire 24a.

When the other surface side wire 24a exists adjacent to the other surface side electrode 24 on the other surface 12 of the substrate 10 in this way, by forming the solder resist film 80 continuously so as to connect them, the level difference caused by the solder resist film 80 can be reduced more conspicuously.

Here, the solder resist film 80 can be any substance as long as it covers at least the other surface 12 of the substrate 10 and may not be a substance to cover the other surface side wire 24a. Tenth Embodiment can be combined appropriately with the above embodiments except Sixth Embodiment and Seventh Embodiment as long as the solder resist film 80 has the aforementioned specific configuration on the premise of the half-mold structure.

Further, also in the present embodiment, the thickness of the other surface side land 24 constituting the thermal diffusion insulating section 40a is smaller than the total thickness of the other surface side wire 24a and the solder resist film 80 to cover the other surface side wire 24a, the portion of the substrate 10 corresponding to the heat dissipation contributing region Z bends so that the one surface 11 of the substrate 10 is recessed and the other surface 12 of the substrate 10 is projected, and thereby the center of the portion protrudes from the periphery. Here, the same can apply to the embodiment of the solder resist shown in FIG. 6B. The same effect as shown in FIG. 6B can be exhibited thereby.

Eleventh Embodiment

Figure 12:
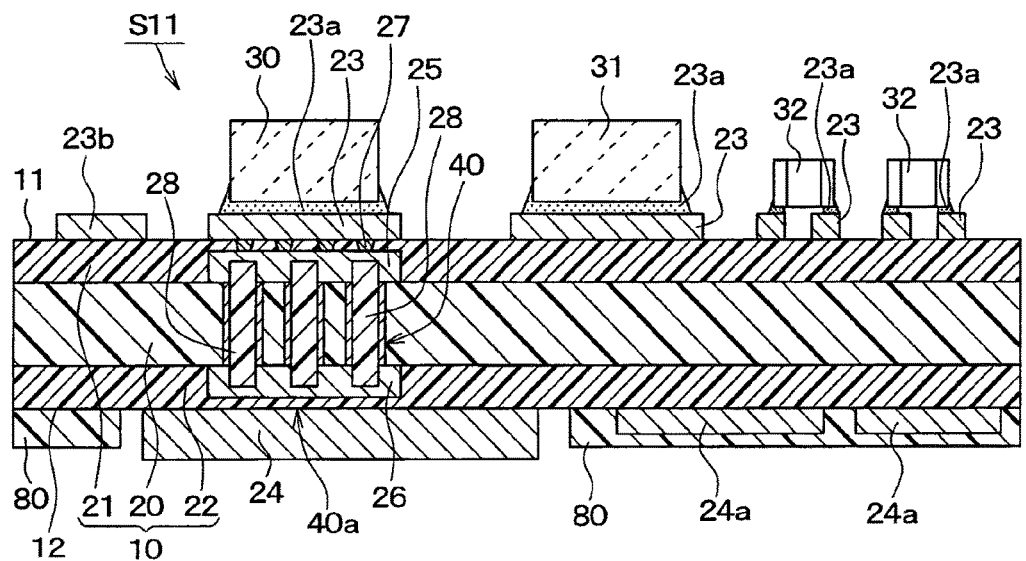
FIG. 12 is a schematic sectional view of an electronic device according to Eleventh Embodiment of the present disclosure.

An electronic device S11 according to Eleventh Embodiment of the present disclosure is described in reference to FIG. 12 while the descriptions are focused on the differences from Eighth Embodiment.

As shown in FIG. 12, also in the present embodiment, the solder resist film 80 to cover and protect the other surface 12 of the substrate 10 is disposed on the other surface 12 of the substrate 10. In the present embodiment here, the solder resist film 80 is arranged apart from the other surface side electrode 24 around the whole periphery of the other surface side electrode 24 while the other surface side electrode 24 is exposed.

That is, the whole other surface side electrode 24 is exposed from the solder resist film 80 on the other surface 12 of the substrate 10. As a result, in the present embodiment, there is the advantage that an area for dissipating heat to the exterior can be increased on the side of the other surface 12 of the substrate 10.

Here, although the relationship between the thickness of the other surface side electrode 24 and the thickness of the other surface side wire 24a is not limited, the following configuration is more desirable.

That is, the other surface side wire 24a is disposed apart from the other surface side electrode 24 at a portion adjacent to the other surface side electrode 24 on the other surface 12 of the substrate 10 and the other surface side electrode 24 is thicker than the other surface side wire 24a. Since the other surface side electrode 24 thereby can protrude from the other surface side wire 24a around the other surface side electrode 24, the other surface side electrode 24 can be connected advantageously to the planar external heat dissipation member 60.

Although this does not limit the present embodiment also, it is more desirable to adopt the following configuration.

As shown in FIG. 12, the solder resist film 80 to cover and protect the other surface 12 of the substrate 10 is disposed on the other surface 12 of the substrate 10. The solder resist film 80 covers the other surface side wire 24a around the other surface side electrode 24 while the other surface side electrode 24 is exposed over the whole surface.

Here, it is more desirable that the thickness of the other surface side electrode 24 is larger than the total thickness of the other surface side wire 24a and the solder resist film 80 to cover the other surface side wire 24a. Since the other surface side electrode 24 thereby can protrude from the solder resist film 80 around the other surface side electrode 24, the other surface side electrode 24 can be connected advantageously to a planar external heat dissipation member 60.

Here, Eleventh Embodiment has the configuration of exposing the whole of the other surface side electrode 24 as the other surface side land from the solder resist film 80 and hence may have the configuration of applying sealing by the molding resin 70. That is, the present embodiment can be combined appropriately with the above embodiments except Seventh Embodiment and Tenth Embodiment.

Twelfth Embodiment

Figure 13:
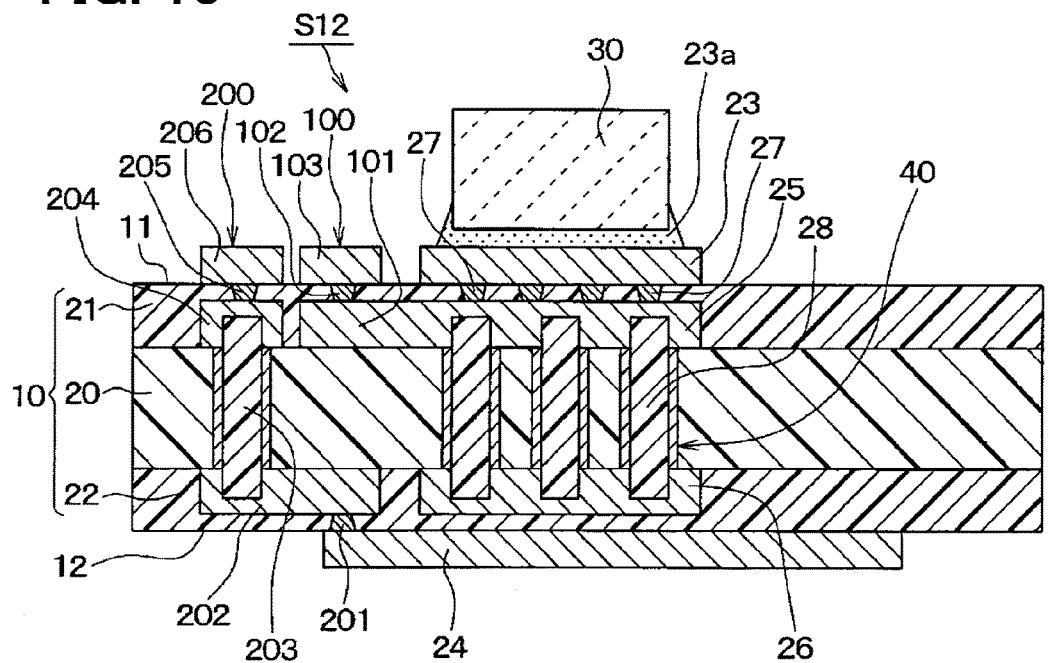
FIG. 13 is a schematic sectional view showing a substantial part of an electronic device according to Twelfth Embodiment of the present disclosure.

An electronic device S12 according to Twelfth Embodiment of the present disclosure is described in reference to FIG. 13.

As shown in FIG. 13, a first inspection wire 100 to extract a heat dissipation path 40 to the one surface 11 of the substrate 10 and a second inspection wire 200 to extract the other surface side electrode 24 to the one surface 11 of the substrate 10 are disposed on the substrate 10.

In the example of FIG. 13, the first inspection wire 100 includes an inner layer wire section 101 extracted from the one surface side inner layer wire 25 in the heat dissipation path 40, a conductor pad 103 disposed on the one surface 11 of the substrate 10, and a laser via 102 to connect the inner layer wire section 101 to the conductor pad 103.

Here, the conductor pad 103 is patterned together with the one surface side electrode 23 and the one surface side wire 23b. Further, the inner layer wire section 101 is disposed between the core 20 and the one surface side insulating layer 21 and patterned together with the one surface side inner layer wire 25. The laser via 102 passes through the one surface side insulating layer 21 and is formed in the same manner as the laser vias 27 of the heat dissipation path 40.

Meanwhile the second inspection wire 200 is formed by, from the side of the other surface side electrode 24 in sequence, connecting the laser via 201 connected to the other surface side electrode 24, an inner layer wire section 202, a blind via 203, an inner layer wire section 204, a laser via 205, and a conductor pad 206 disposed on the one surface 11 of the substrate 10.

In the second inspection wire 200, the conductor pad 206 is patterned together with the one surface side electrode 23 and the one surface side wire 23b. Further, the laser vias 201 and 205 are formed in the one surface side insulating layer 21 and the other surface side insulating layer 22 respectively by the same method as the laser vias 27 of the heat dissipation path 40.

Further, the inner layer wire sections 202 and 204 are patterned together with the one surface side inner layer wire 25 and the other surface side inner layer wire 26 respectively. Further, the blind via 203 in the second inspection wire 200 is formed in the same manner as the blind vias 28 of the heat dissipation path 40.

According to the present embodiment, it is possible to inspect the insulation property between the first inspection wire 100 and the second inspection wire 200, those being extracted to the one surface 11, over the one surface 11 of the substrate 10. As a result, it is possible to easily confirm the insulation assurance between the heat dissipation path 40 and the other surface side electrode 24.

Figure 14:
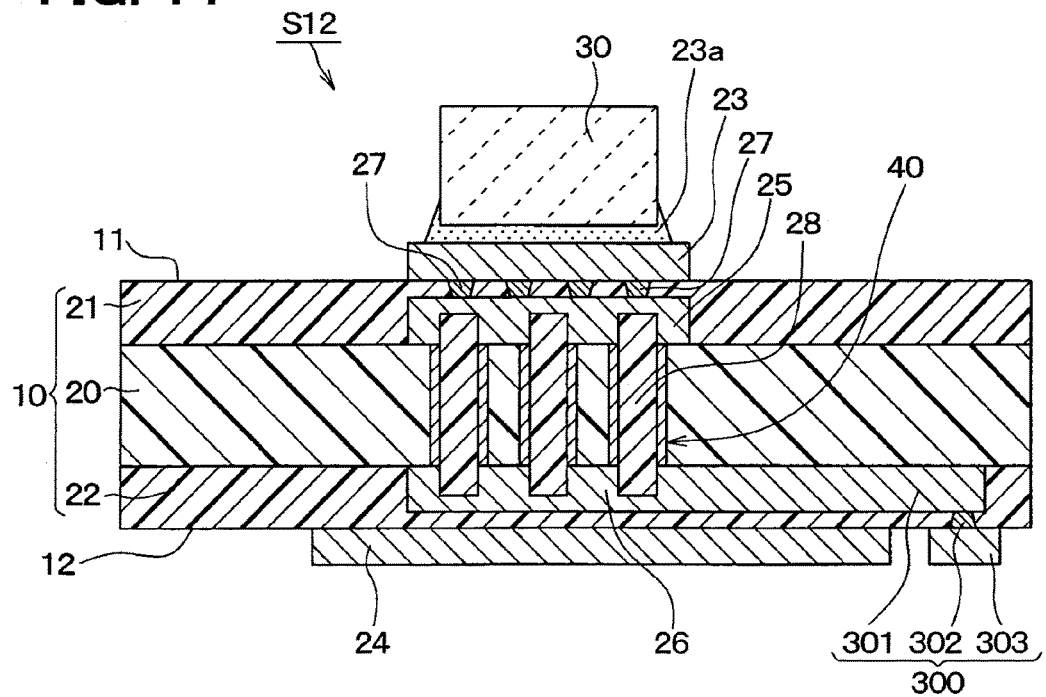
FIG. 14 is a schematic sectional view showing a substantial part of an electronic device as another example according to Twelfth Embodiment.

Another example of the electronic device S12 according to Twelfth Embodiment is described in reference to FIG. 14. Although the insulation property inspection to confirm the insulation assurance between the heat dissipation path 40 and the other surface side electrode 24 is carried out on the one surface 11 of the substrate 10 in the example of FIG. 13, the inspection is carried out on the other surface 12 of the substrate 10 in the example of FIG. 14.

In the example of FIG. 14, an inspection wire 300 to extract the heat dissipation path 40 to the other surface 12 of the substrate 10 is disposed on the substrate 10. The inspection wire 300 shown in FIG. 14 includes an inner layer wire section 301 extracted from an other surface side inner layer wire 26 of the heat dissipation path 40, a conductor pad 303 disposed on the other surface 12 of the substrate 10, and a laser via 302 to connect the inner layer wire section 301 to the conductor pad 303.

Here, the conductor pad 303 in FIG. 14 is patterned together with then other surface side electrode 24 and the other surface side wire 24a. Further, the inner layer wire section 301 is disposed between the core 20 and the other surface side insulating layer 22 and is patterned together with the other surface side inner layer wire 26. The laser via 302 passes through the other surface side insulating layer 22 and is formed by the same method as the laser vias 27 of the heat dissipation path 40.

According to the present embodiment, it is possible to inspect the insulation property between the inspection wire 300 and the other surface side electrode 24, those being extracted to the other surface 12, over the other surface 12 of the substrate 10. As a result, it is possible to easily confirm the insulation assurance between the heat dissipation path 40 and the other surface side electrode 24.

Here, in the first inspection wire 100 to extract the heat dissipation path 40 to the one surface 11 of the substrate 10 and the inspection wire 30 to extract the heat dissipation path 40 to the other surface 12 of the substrate 10, the extraction sections of the heat dissipation path 40 are not limited to the examples shown in FIGS. 13 and 14.

For example, the first inspection wire 100 may be extracted from the other surface side inner layer wire 26 of the heat dissipation path 40 and the inspection wire 300 may be extracted from the one surface side inner layer wire 25 of the heat dissipation path 40. Also in those cases, each of the inspection wires 100 and 300 is configured by appropriately forming an inner layer wire section, a laser via, and a blind via, for example.

Further, since the present embodiment is configured by adding the inspection wires 100, 200, and 300, the present embodiment can be combined appropriately with all the above embodiments.

Thirteenth Embodiment

In the present embodiment, the relationship of the physical properties, configurations, and others among the layers of the one surface side insulating layer 21, the core 20, and the other surface side insulating layer 22 is described further in the configurations of the above embodiments.

In the above embodiments, the substrate 10 is provided by a stack of the core 20 as a core layer located in the interior of the substrate 10, the one surface side insulating layer 21 being stacked over the core 20 on the side of the one surface 11 of the substrate 10 and constituting the one surface 11 of the substrate 10, and the other surface side insulating layer 22 being stacked over the core 20 on the side of the other surface 12 of the substrate 10 and constituting the other surface 12 of the substrate 10.

In the configuration of the substrate 10 made of such a laminated substrate, it is desirable that the thermal conductivities of the one surface side insulating layer 21 and the other surface side insulating layer 22 are not lower than the thermal conductivity of the core 20. As a result, it is possible to restrict a relatively expensive heat dissipation material to a minimum requisite quantity and configure a highly-exoergic substrate 10 at a low cost.

Further in this case, it is desirable that the thermal conductivity of the other surface side insulating layer 22 is higher than the thermal conductivity of the one surface side insulating layer 21. As a result, the heat dissipation efficiency improves preferably on the side of the other surface 12 of the substrate 10.

Further, in the substrate 10 provided by stacking the one surface side insulating layer 21, the core 20, and the other surface side insulating layer 22 in sequence, it is desirable that the one surface side insulating layer 21 is thicker than the other surface side insulating layer 22. As a result, the thickness of the substrate 10 is secured by the thicker one surface side insulating layer 21 and moreover the heat dissipation property of the other surface 12 of the substrate 10 is expected to improve by the thinner other surface side insulating layer 22.

Fourteenth Embodiment

Figure 15:
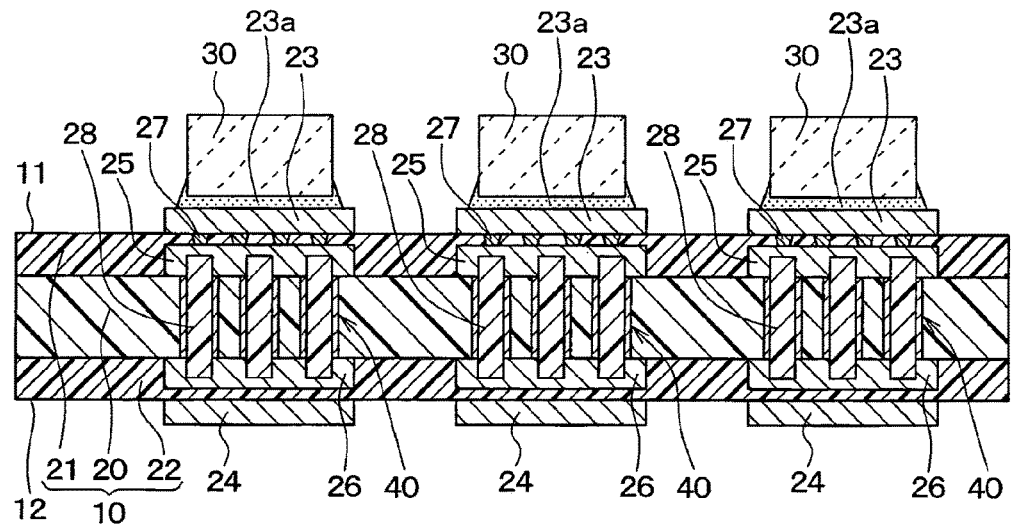
FIG. 15 is a schematic sectional view showing a substantial part of an electronic device according to Fourteenth Embodiment of the present disclosure.

An electronic device according to Fourteenth Embodiment of the present disclosure is described in reference to FIG. 15. Although one heat generating element 30 is disposed on the one surface 11 of the substrate 10 in the above embodiments, a plurality of heat generating elements may be disposed.

Figure 16:
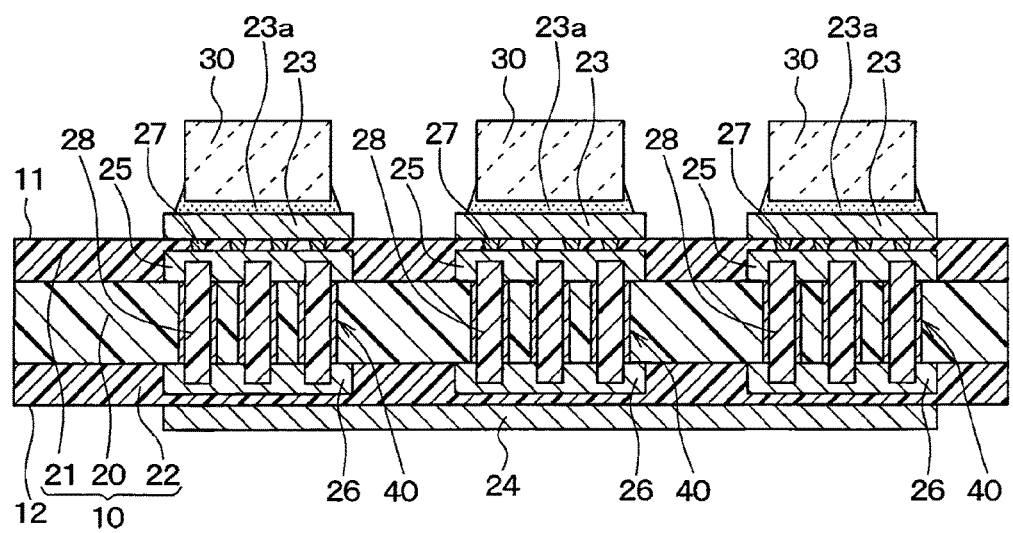
FIG. 16 is a schematic sectional view showing a substantial part of an electronic device as another example according to Fourteenth Embodiment.

That is, as shown in FIG. 15, a plurality of one surface side electrodes 23 are disposed on the one surface 11 of the substrate 10 and a plurality of heat generating elements 30 are joined to the one surface side electrodes 23 with the electrically-conductive joining materials 23a interposed respectively. The heat dissipation path 40 and the other surface side electrode 24 are disposed right under each of the heat generating elements 30. In this case further, as shown in FIG. 16, one other surface side electrode 24 used commonly for the plurality of heat dissipation paths 40 may be provided.

Other Embodiments

Here, although the substrate 10 has the three layered structure formed by stacking the one surface side insulating layer 21, the core 20, and the other surface side insulating layer 22 in sequence in the above embodiments, the substrate 10 may comprise four or more layers for example. For example, a substrate of a five-layered structure is obtained by stacking a two-layered insulating layer over the core 20 on the side of the one surface 11 of the substrate 10 and stacking a two-layered insulating layer over the core 20 on the side of the other surface 12 of the substrate 10.

Also in the case of the five-layered structure, the heat dissipation path may be configured by forming inner layer wires like the inner layer wires 25 and 26 between layers, forming the laser vias 27 and the blind vias 28 in the layers, and connecting the inner layer wires from the one surface side electrode 23. In this case, the one surface side inner layer wire and the other surface side inner layer wire are made of two layers, respectively. Also in this case, the inner layer wire touching the insulating layer constituting the other surface 12 of the substrate 10 on the side closest to the other surface is an end point of the relevant heat dissipation path, and the end point is not exposed to the other surface 12 of the substrate 10.

Figure 17:
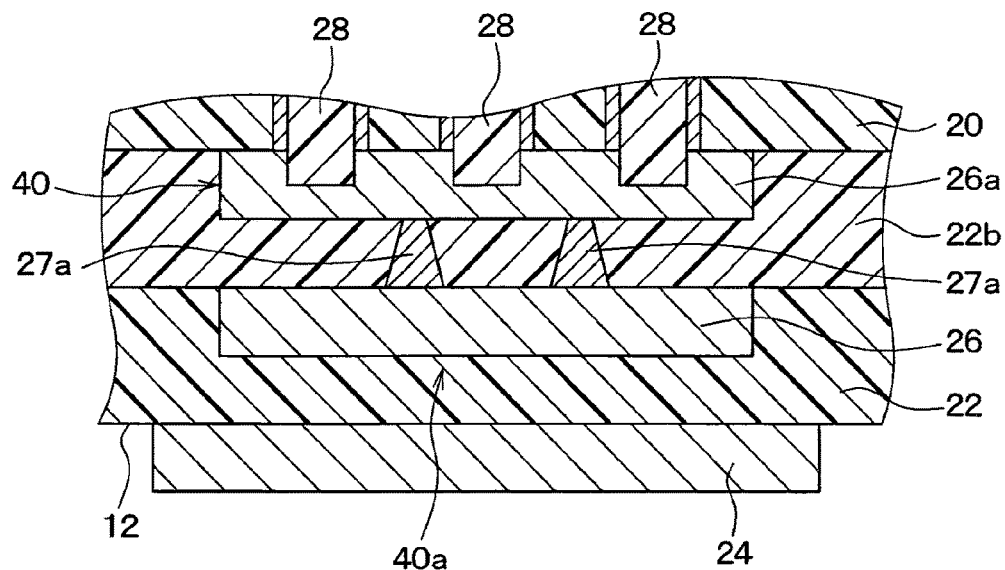
FIG. 17 is a schematic sectional view showing a substantial part of an electronic device according to another embodiment of the present disclosure.

Here, the case of the other surface side insulating layer having two layers is shown in FIG. 17 as an example. In FIG. 17, an additional other surface side insulating layer 22b is interposed between the other surface side insulating layer 22 constituting the other surface 12 of the substrate 10 and the core 20.

In this case, an inner layer wire 26a connected to blind vias 28 exists between the core 20 and the additional other surface side insulating layer 22b. The laser vias 27a to connect the inner layer wire 26a to the other surface side inner layer wire 26 that is the end point of the heat dissipation path 40 are provided in the additional other surface side insulating layer 22b. As a result, the heat dissipation path 40 is configured appropriately also in FIG. 17.

Figure 18:
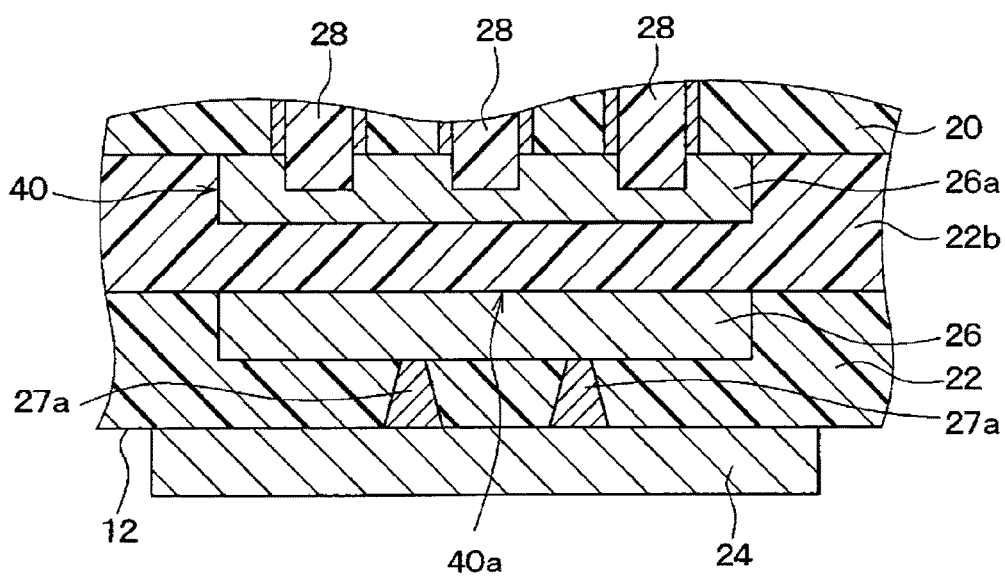
FIG. 18 is a schematic sectional view showing a substantial part of an electronic device according to another embodiment of the present disclosure.

Further, the case of the other surface side insulating layer having two layers is shown in FIG. 18 as another example. The example of FIG. 18 is the case of modifying a part of the example of FIG. 17 and the inner layer wire 26a that is the end point of the heat dissipation path 40 is insulated from the other surface side inner layer wire 26 with the additional other surface side insulating layer 22b interposed.

The laser vias 27a are formed not in the additional other surface side insulating layer 22b but in the other surface side insulating layer 22 on the side of the other surface 12 of the substrate 10 and the other surface side inner layer wire 26 is connected to the other surface side electrode 24 through the laser vias 27a. As a result, the heat dissipation path 40 is configured appropriately also in FIG. 18.

In this case, the other surface side electrode 24 is configured so that the other surface side inner layer wire 26 and the laser vias 27a may exist on the side closer to the other surface 12 of the substrate 10 than the inner layer wire 26a that is the end point of the heat dissipation path 40. There is no problem even when the other surface side insulating layers 22 and 22b constituting the side of the other surface 12 of the substrate 10 as a part of the substrate 10 are not single layers but are multilayers in this way.

Further, the substrate 10 may be any substrate as long as a part thereof on the side of the other surface 12 includes the other surface side insulating layer 22 disposed on the whole of the substrate in the planar direction of the substrate 10 and the one surface side insulating layer 21 may be excluded for example. In this case, the one surface side electrode 23 may be disposed on the blind vias 28 on the surface of the core 20 forming the one surface 11 of the substrate 10 for example. Further, the heat dissipation path 40 may be disposed right under the heat generating element 30 and is not limited to the above configurations.

Further, although the other surface side electrode 24 as an other surface side land is connected to the external heat dissipation member 60 in the above embodiments, for example, the other surface side electrode 24 may not be connected to the external heat dissipation member 60 but be exposed directly to the exterior. In this case, for example, the heat from the other surface side electrode 24 is dissipated in the air.

Further, the dimensions of the one surface side electrode 23, the one surface side inner layer wire 25, the other surface side inner layer wire 26, and the other surface side electrode 24 of the heat dissipation path 40 in the planar direction of the substrate 10 are not limited to the magnitude relationships described in the above embodiments. That is, the dimensions of the one surface side electrode 23, the other surface side inner layer wire 26, and the other surface side electrode 24 have to be indispensably larger than the dimension of the heat generating element 30 but the dimensions other than those may arbitrarily change the magnitude relationships.

Further, the one surface side electrode 23 may be any substance as long as it functions as a land for joining the heat generating element 30, the other surface side electrode 24 may be any substance as long as it functions as a land for dissipating heat, and they are not limited to substances functioning as electrodes.

Further, although there are some cases of not sealing the side of the one surface 11 of the substrate 10 with the molding resin 70 in the examples of the above embodiments shown in the figures, also in those cases, it is possible to seal the side of the one surface 11 of the substrate 10 with the molding resin 70 and expose the side of the other surface 12 from the molding resin 70.

Further, although the inner layer wires 25 and 26 are integrated with the lid plating of the visa 27 and 28 respectively in the above embodiments, they are not limited to the cases. The inner layer wires may be layers having the holes of the vias 27 and 28 but not having lid plating.

Further, the present disclosure is not limited to the above embodiments and can be changed arbitrarily in the range described in the claims. Further, the above embodiments are not unrelated to each other, can be combined arbitrarily except the case where the combination is obviously impossible, and are not limited to the examples shown in the figures. Further, in the above embodiments, it goes without saying that the components constituting the embodiments are not necessarily essential except the cases of being particularly specified as essential and being obviously thought to be essential in principle. Further, in the above embodiments, when numerical values such as the number of constituent components, a numerical value, a quantity, a range, and others in the embodiments are referred to, the numerical value is not limited to the specific number except the cases of being specified particularly as essential and being limited to the specific number obviously in principle. Further, in the above embodiments, when the shape, positional relationship, and the like of a constituent component or the like are referred to, they are not limited to the specific shape, positional relationship, and the like except the cases of being specified particularly and being limited to the specific shape, positional relationship, and the like in principle.

The invention claimed is:

1. An electronic device comprising:
   an electrically-insulative substrate having one surface and an other surface;
   a heat generating element mounted on the one surface of the substrate;
   an other element mounted on the one surface of the substrate;
   a one surface side wire disposed on the one surface of the substrate;
   an electrically-conductive one surface side land disposed on the one surface of the substrate and patterned together with the one surface side wire;
   an other surface side wire disposed on the other surface of the substrate; and
   an electrically-conductive other surface side land disposed on the other surface of the substrate, patterned together with the other surface side wire, and being electrically independent from at least a part of the other surface side wire, wherein:
   the heat generating element has a joining plane to be joined electrically to the one surface side land;
   the one surface side land has a joined plane to be joined electrically to the heat generating element;
   the joined plane exists at least in a whole projected region of the joining plane projected onto the substrate in a thickness direction of the substrate;
   the electronic device has an electrically-conductive joining material to directly join the joining plane to the joined plane in the whole projected region;
   the other surface of the substrate is provided by an other surface side insulating layer that is disposed entirely in the planar direction of the substrate as a part of the substrate, and has an electrical insulation property;
   the electronic device includes an electrically-conductive heat dissipation path having the one surface side land and the electrically-conductive joining material as a start point, being disposed to extend continuously from the one surface side of the substrate to the other surface side substrate insulating layer, and dissipating heat generated in the heat generating element to the other surface side of the substrate;
   an end point of the heat dissipation path is provided by an electrically-conductive other surface side inner layer wire disposed in an interior of the substrate; and
   when a region obtained by expanding a planar size of the heat generating element in the planar direction of the substrate from the heat generating element further outwardly by an extent corresponding to a thickness of the substrate at a whole periphery of the heat generating element is defined as a heat dissipation contributing region, the other surface side substrate insulating layer is interposed between the other surface side inner layer wire and the other surface side land in the heat dissipation contributing region and electrically insulates the other surface side inner layer wire from the other surface side land, at least a part of the other surface side inner layer wire and at least a part of the other surface side land have a total area larger than an area of the heat generating element in the planar direction of the substrate in the heat dissipation contributing region and constitute a thermal diffusion layer pair, thereby to constitute a thermal diffusion insulating section made of the other surface side inner layer wire, the other surface side land, and the other surface side substrate insulating layer, on the other surface side of the substrate, the substrate is made of a resin, a molding resin is disposed on the one surface side of the substrate to seal the heat generating element, the other element, the one surface side wire, and the one surface of the substrate, the other surface of the substrate is exposed from the molding resin, a solder resist film is disposed on the other surface of the substrate to cover and protect the other surface side wire while at least a part of the other surface side land constituting the thermal diffusion insulating section is exposed, a thickness of the other surface side land constituting the thermal diffusion insulating section is smaller than a total thickness of the other surface side wire and the solder resist film covering the other surface side wire, and a portion of the substrate corresponding to the heat dissipation contributing region bends so that the one surface of the substrate is recessed and the other surface of the substrate is projected, and thereby a center of the site protrudes from a periphery thereof.

2. The electronic device according to claim 1, wherein the other surface side land is connected to an external heat dissipation member.

3. The electronic device according to claim 1, wherein the heat dissipation path has:

a one surface side inner layer wire extending in the planar direction of the substrate and being located in the interior of the substrate on the one surface side of the substrate; and a blind via extending in the thickness direction of the substrate and connecting the one surface side inner layer wire to the other surface side inner layer wire.

4. The electronic device according to claim 3, wherein:

the heat dissipation path further has a laser via extending in the thickness direction of the substrate and connecting the one surface side land to the one surface side inner layer wire; and the laser via is located at a position without overlapping with the blind via and being away from the blind via in the planar direction of the substrate.

5. The electronic device according to claim 3, wherein at least of a part of the one surface side inner layer wire constitutes a thermal diffusion layer having a total area larger than an area of the heat generating element in the planar direction of the substrate in the heat dissipation contributing region.

6. The electronic device according to claim 3, wherein:

dimensions of the one surface side land and the one surface side inner layer wire in the planar direction of the substrate are equal to each other; and dimensions of the other surface side inner layer wire and the other surface side land in the planar direction of the substrate are respectively larger than dimensions of the one surface side land and the one surface side inner layer wire in the planar direction of the substrate.

7. The electronic device according to claim 6, wherein the dimension of the other surface side land in the planar direction of the substrate is larger than the dimension of the other surface side inner layer wire in the planar direction of the substrate.

8. The electronic device according to claim 1, wherein:

the solder resist film is arranged around the other surface side land to cover a periphery of the other surface side land while the other surface side land is exposed; and a covering section of the solder resist film covering the periphery of the other surface side land is thinner than a portion of the solder resist film located around the other surface side land on the other surface of the substrate.

9. The electronic device according to claim 8, wherein:

a portion of the substrate corresponding to the heat dissipation contributing region is deformed so that the portion of the substrate is recessed on the one surface of the substrate and the portion of the substrate is projected on the other surface of the substrate, and a center of the portion protrudes from the periphery thereof.

10. The electronic device according to claim 8, wherein a thickness of a portion of the solder resist film located between the covering section and the portion located around the other surface side land on the other surface of the substrate changes to have a tapered shape.

11. The electronic device according to claim 8, wherein the solder resist film is arranged continuously from around the other surface side land to the covering section while covering the other surface side wire.

12. The electronic device according to claim 1, wherein:

the solder resist film is arranged apart from the other surface side land entirely around the periphery of the other surface side land while the other surface side land is exposed.

13. The electronic device according to claim 1, wherein the other surface side land is thicker than the other surface side wire.

14. The electronic device according to claim 13, wherein:

a solder resist film is disposed on the other surface of the substrate to cover and protect the other surface of the substrate;

the solder resist film covers the other surface side wire around the other surface side land while the other surface side land is exposed; and the thickness of the other surface side land is larger than a total thickness of the other surface side wire and the solder resist film covering the other surface side wire.

15. The electronic device according to claim 1, wherein the other surface side land is electrically independent from all electrically-conductive elements in the substrate other than the other surface side land.

16. The electronic device according to claim 1, wherein the substrate is provided with a first inspection wire to extract the heat dissipation path to the one surface of the substrate and a second inspection wire to extract the other surface side land to the one surface of the substrate.

17. The electronic device according to claim 1, wherein the substrate is provided with an inspection wire to extract the heat dissipation path to the other surface of the substrate.

18. The electronic device according to claim 1, wherein:
the substrate includes a core layer located in the interior of the substrate and a one surface side substrate insulating layer being stacked on the core layer on the one surface side of the substrate and constituting the one surface of the substrate, the other surface side substrate insulating layer is stacked on the core layer on the other surface side of the substrate; and
thermal conductivities of the one surface side substrate insulating layer and the other surface side substrate insulating layer are not lower than a thermal conductivity of the core layer.

19. The electronic device according to claim 18, wherein the thermal conductivity of the other surface side substrate insulating layer is higher than the thermal conductivity of the one surface side substrate insulating layer.

20. The electronic device according to claim 1, wherein:
the substrate includes a core layer located in the interior of the substrate and a one surface side substrate insulating layer being stacked on the core layer on the one surface side of the substrate and constituting the one surface of the substrate, and the other surface side substrate insulating layer is stacked on the core layer on the other surface side of the substrate; and
the one surface side substrate insulating layer is thicker than the other surface side substrate insulating layer.

* * * * *